United States Patent
Ohshima et al.

(10) Patent No.: US 12,041,762 B2
(45) Date of Patent: Jul. 16, 2024

(54) SEMICONDUCTOR DEVICE OR OSCILLATOR

(71) Applicant: SEMICONDUCTOR ENERGY LABORATORY CO., LTD., Atsugi (JP)

(72) Inventors: Kazuaki Ohshima, Kanagawa (JP); Hitoshi Kunitake, Kanagawa (JP); Takahiro Fukutome, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 411 days.

(21) Appl. No.: 17/612,873

(22) PCT Filed: May 19, 2020

(86) PCT No.: PCT/IB2020/054716
§ 371 (c)(1),
(2) Date: Nov. 19, 2021

(87) PCT Pub. No.: WO2020/240341
PCT Pub. Date: Dec. 3, 2020

(65) Prior Publication Data
US 2022/0246615 A1    Aug. 4, 2022

(30) Foreign Application Priority Data
May 31, 2019    (JP) .................. 2019-102133

(51) Int. Cl.
*H01L 27/14*    (2006.01)
*H01L 27/12*    (2006.01)
(Continued)

(52) U.S. Cl.
CPC ......... *H10B 12/00* (2023.02); *H01L 27/1225* (2013.01); *H01L 27/1255* (2013.01); *H01L 29/78648* (2013.01); *H01L 29/7869* (2013.01)

(58) Field of Classification Search
CPC ............... H10B 12/00; H01L 27/1225; H01L 27/1255; H01L 29/78648; H01L 29/7869;
(Continued)

(56) References Cited

U.S. PATENT DOCUMENTS 8,773,906 B2    7/2014   Ohmaru
9,202,567 B2   12/2015   Ohmaru
(Continued)

FOREIGN PATENT DOCUMENTS

JP      04-132748 A    12/1992
JP    2004-056561 A     2/2004
(Continued)

OTHER PUBLICATIONS

International Search Report (Application No. PCT/IB2020/054716) dated Sep. 1, 2020.
(Continued)

*Primary Examiner* — Tan N Tran
(74) *Attorney, Agent, or Firm* — Fish & Richardson P.C.

(57) ABSTRACT

A semiconductor device in which temperature dependence is reduced is provided. A switched capacitor is formed using a second transistor, a third transistor, and a second capacitor. Semiconductor layers of the second transistor and the third transistor that include an oxide can reduce temperature dependence. An AC signal supplied to the gates of the second transistor and the third transistor is converted into a DC voltage through the switched capacitor. Note that the level of the DC voltage is adjusted by the levels of the voltages supplied to the back gates of the second transistor and the third transistor.

3 Claims, 20 Drawing Sheets

(51) Int. Cl.
 *H01L 29/786* (2006.01)
 *H10B 12/00* (2023.01)
(58) Field of Classification Search
 CPC ............. H01L 21/8258; H01L 27/0629; H01L 27/0688; H01L 27/088; H03L 7/085
 USPC .............................................. 257/59, 72, 43
 See application file for complete search history.

(56) References Cited

U.S. PATENT DOCUMENTS

| | | | |
|---|---|---|---|
| 9,438,206 B2 | 9/2016 | Maehashi et al. | |
| 10,164,612 B2 | 12/2018 | Maehashi et al. | |
| 2011/0018619 A1* | 1/2011 | Cassia .................... | H02M 3/07 327/537 |
| 2012/0195122 A1 | 8/2012 | Ohmaru | |
| 2015/0061742 A1 | 3/2015 | Maehashi et al. | |

FOREIGN PATENT DOCUMENTS

| | | |
|---|---|---|
| JP | 2011-223142 A | 11/2011 |
| JP | 2012-070224 A | 4/2012 |
| JP | 2012-257192 A | 12/2012 |
| JP | 2016-129345 A | 7/2016 |
| KR | 2012-0087087 A | 8/2012 |
| WO | WO-2012/137590 | 10/2012 |
| WO | WO-2015/030150 | 3/2015 |

OTHER PUBLICATIONS

Written Opinion (Application No. PCT/IB2020/054716) dated Sep. 1, 2020.
Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
松澤昭,"アナログ・RF回路の先端設計技術動向 その2 ひびきの半導体アカデミー講座「アナログ・RF回路の先端設計技術動向」, 電気学会 九州支部. ,
Jul. 3, 2008, pp. 1-59.
スイッチトキャパシタ, https://ja.wikipedia.org/wiki/%E3%82%B9% E3%82%A4%E3%83%83%E3%83%81%E3%83%88%E3%82% AD%E3%83%A3%E3%83%91%E3%82%B7%E3%82%BF, Apr. 2, 2018.
Akira Matsuzawa, "Advanced Design Technology Trends in Analog and RF Circuits Part2", Hibikino Semiconductor Academy Lecture "Advanced Design Technology Trends in Analog and RF Circuits", Jul. 3, 2008, pp. 1-59, IEEJ Kyushu Branch.
Switched Capacitor, https://ja.wikipedia.org/wiki/%E3%82%B9% E3%82%A4%E3%83%83%E3%83%81%E3%83%88%E3%82% AD %E3%83%A3%E3%83%91%E3%82%B7%E3%82%BF, Apr. 2, 2018.

* cited by examiner

FIG. 12A
Intermediate state
New crystalline phase
| Amorphous | Crystalline | Crystal |
|---|---|---|
| • completely amorphous | • CAAC<br>• nc<br>• CAC<br>excluding single crystal and poly crystal | • single crystal<br>• poly crystal |
FIG. 12B
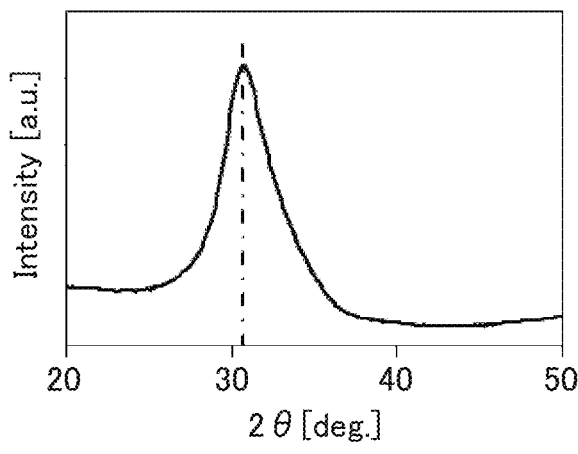
FIG. 12C
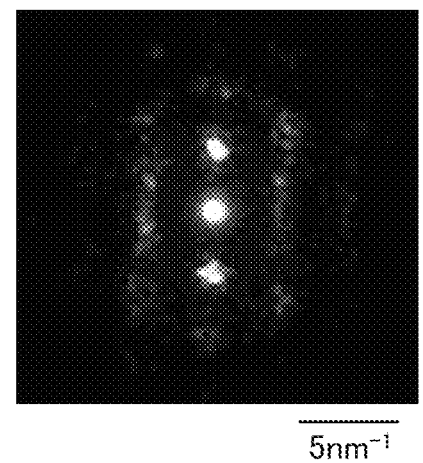

SEMICONDUCTOR DEVICE OR OSCILLATOR

CROSS REFERENCE TO RELATED APPLICATIONS

This application is a U.S. National Phase Application under 35 U.S.C. § 371 of International Application PCT/IB2020/054716, filed on May 19, 2020, which is incorporated by reference and claims the benefit of a foreign priority application filed in Japan on May 31, 2019, as Application No. 2019-102133.

TECHNICAL FIELD

One embodiment of the present invention relates to a semiconductor device or an oscillator including a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. Thus, a semiconductor element such as a transistor or a diode and a circuit including a semiconductor element are semiconductor devices. A display device, a light-emitting device, a lighting device, an electro-optical device, a communication device, an electronic device, and the like may include a semiconductor element or a semiconductor circuit. Therefore, a display device, a light-emitting device, a lighting device, an electro-optical device, an imaging device, a communication device, an electronic device, and the like are referred to as a semiconductor device in some cases.

BACKGROUND ART

Information terminals that are easy to carry, typified by smartphones, tablet terminals, and the like, have come into widespread use. With the widespread use of information terminals, various communication standards have been established. For example, the use of an LTE-Advanced standard called the fourth-generation mobile communication system (4G) has started.

Nowadays, the amount of data used in electronic devices tends to increase due to the development of information technology, such as IOT (Internet of Things) which connects electronic devices other than information terminals (e.g., in-vehicle electronic devices, home electronic appliances, devices for houses, devices for buildings, or wearable devices) to the Internet. In addition, the communication speed of electronic devices such as information terminals needs to be improved.

To achieve IoT, the number of electronic devices that are additionally connected to the Internet is increased; thus, the number of electronic devices that can be connected to the Internet at a time needs to be increased. Furthermore, since a large number of electronic devices are connected to the Internet at a time, a communication time lag (can be referred to as delay) occurs. Thus, in order to be compatible with various kinds of information technology including IoT, a new communication standard called the fifth-generation mobile communication system (5G) that achieves higher transmission speed, more simultaneous connections, and shorter delay time than 4G has been examined. Note that 5G uses communication frequencies of a 3.7 GHz band, a 4.5 GHz band, and a 28 GHz band.

Patent Document 1 discloses a semiconductor device that generates a high-accuracy clock signal even in the case where the communication frequency used by the semiconductor device is changed or the power supply voltage, the temperature, or the like of the semiconductor device is changed.

A 5G compatible semiconductor device is manufactured using a semiconductor containing one kind of element such as Si as its main component or a compound semiconductor containing a plurality of kinds of elements such as Ga and As as its main components. Furthermore, an oxide semiconductor, which is one kind of metal oxide, has attracted attention.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCES

Patent Document

[Patent Document 1] Japanese Published Patent Application No. 2012-70224

Non-Patent Documents

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

It is known that electronic devices generate heat when communication speed increases. There is a problem in that semiconductor devices included in electronic devices have increased leakage current in a high-temperature environment, and the leakage current causes malfunction. Furthermore, it is known that a communication system of a superheterodyne system is used in 5G or the like. The superheterodyne system includes a mixer, and the mixer includes a semiconductor device. The mixer includes a semiconductor device functioning as a local oscillator. The mixer can extract a difference between the frequency of a signal received by an antenna and an oscillation frequency generated by the local oscillator. There is a problem in that the difference between the frequencies cannot be detected correctly when the local oscillator is affected by temperature or the like.

An object of one embodiment of the present invention is to provide a semiconductor device or the like that generates stable frequencies. Another object is to provide a highly reliable semiconductor device or the like with reduced temperature dependence. Another object is to provide a semiconductor device or the like with high productivity. Another object is to provide a novel semiconductor device or the like.

Note that the description of these objects does not preclude the existence of other objects. In one embodiment of the present invention, there is no need to achieve all the objects. Note that objects other than these are apparent from the description of the specification, the drawings, the claims, and the like, and objects other than these can be derived from the description of the specification, the drawings, the claims, and the like.

Means for Solving the Problems

One embodiment of the present invention is a semiconductor device including a first transistor, a second transistor, a third transistor, a first capacitor, a second capacitor, and a functional element. Semiconductor layers of the first transistor to the third transistor include an oxide semiconductor. A gate of the first transistor is electrically connected to one of a source and a drain of the first transistor. The other of the source and the drain of the first transistor is electrically connected to one of a source and a drain of the second transistor and one electrode of the first capacitor. The other of the source and the drain of the second transistor is electrically connected to one of a source and a drain of the third transistor and one electrode of the second capacitor. One electrode of the functional element is electrically connected to a gate of the second transistor and a gate of the third transistor. An AC signal is supplied to the gates of the second transistor and the third transistor through the functional element. A first voltage is supplied to back gates of the second transistor and the third transistor. A second voltage applied to the one electrode of the first capacitor is changed by control of the first voltage.

Described in detail, a switched capacitor is formed using the second transistor, the third transistor, and the second capacitor. Note that the semiconductor layers of the first transistor to the third transistor that include an oxide can reduce temperature dependence. An AC signal supplied to the gate of the second transistor and the gate of the third transistor is converted into a DC voltage through the switched capacitor. Note that the level of the DC voltage is adjusted by the levels of the voltages supplied to the back gate of the second transistor and the back gate of the third transistor.

In the above structure, the oxide semiconductor included in the first transistor to the third transistor preferably contains at least one of In and Zn.

Another embodiment of the present invention is preferably an oscillator including a voltage control oscillator circuit that changes oscillation frequency depending on the level of the voltage generated by the semiconductor device having the above structure.

Effect of the Invention

According to one embodiment of the present invention, a semiconductor device with reduced power consumption, or the like can be provided. A semiconductor device or the like which stably operates can be provided. A semiconductor device or the like with high reliability can be provided. A semiconductor device or the like with high productivity can be provided. Alternatively, a novel semiconductor device or the like can be provided.

Note that the description of these effects does not preclude the existence of other effects. One embodiment of the present invention does not have to have all these effects. Note that effects other than these are apparent from the description of the specification, the drawings, the claims, and the like, and effects other than these can be derived from the description of the specification, the drawings, the claims, and the like.

BRIEF DESCRIPTION OF THE DRAWINGS

FIG. 12A is a table showing classifications of crystal structures of IGZO. FIG. 12B is a graph showing an XRD spectrum of a CAAC-IGZO film. FIG. 12C is an image showing nanobeam electron diffraction patterns of a CAAC-IGZO film.

MODE FOR CARRYING OUT THE INVENTION

Figure 1:
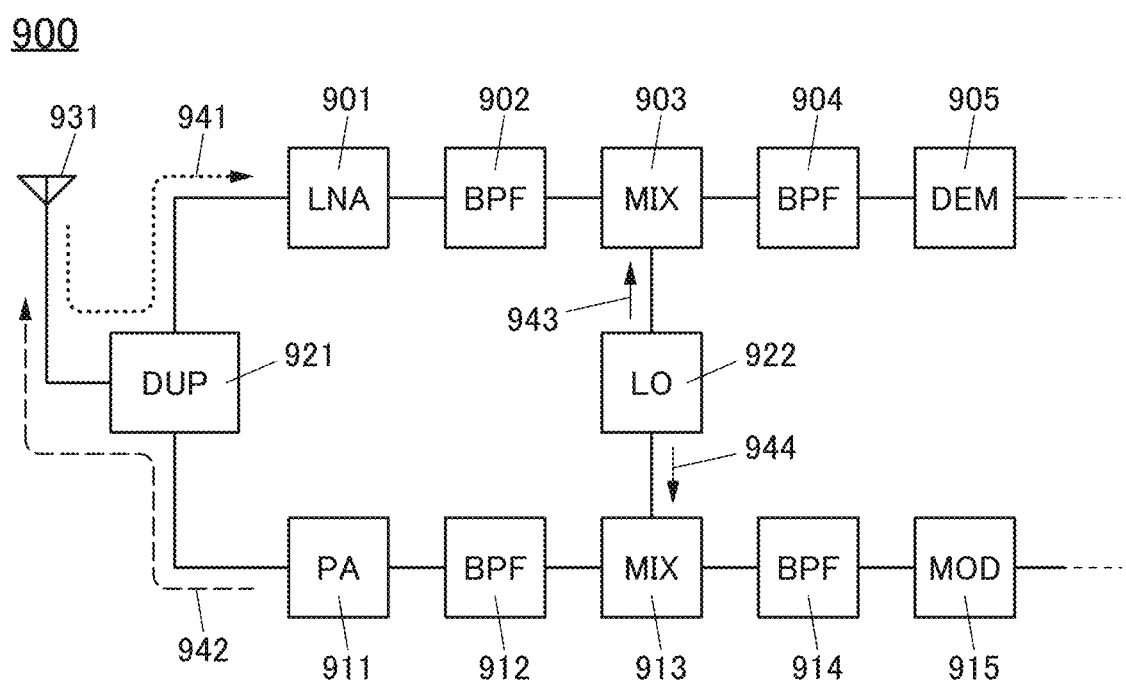
FIG. 1 is a diagram illustrating a configuration example of a wireless transceiver.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

In addition, the position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in drawings and the like. For example, in an actual manufacturing process, a resist mask or the like might be unintentionally reduced in size by treatment such as etching, which is not reflected in some cases for easy understanding.

Furthermore, in a top view (also referred to as a plan view), a perspective view, or the like, the description of some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, the resistance value of a "resistor" is sometimes determined depending on the length of a wiring. Alternatively, a resistor is sometimes formed by a connection of a conductive layer used as a wiring and another conductive layer having a resistivity different from that of the conductive layer through a contact. Alternatively, a resistance value is sometimes determined by impurity doping in a semiconductor layer.

In this specification and the like, a "terminal" in an electric circuit refers to a portion that inputs or outputs current or voltage or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

In addition, functions of a source and a drain are interchanged with each other depending on operation conditions and the like, for example, when a transistor of different polarity is employed or when the current direction is changed in a circuit operation; therefore, it is difficult to define which is the source or the drain. Thus, the terms "source" and "drain" can be interchangeably used in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit. Furthermore, the expression "directly connected" includes the case where wirings formed of different conductive layers are connected through a contact to function as one wiring.

Furthermore, in this specification and the like, "parallel" indicates a state where two straight lines are placed at an angle of greater than or equal to $-10°$ and less than or equal to $10°$, for example. Accordingly, the case where the angle is greater than or equal to $-5°$ and less than or equal to $5°$ is also included. Moreover, "perpendicular" and "orthogonal" indicate a state where two straight lines are placed at an angle of greater than or equal to $80°$ and less than or equal to $100°$, for example. Accordingly, the case where the angle is greater than or equal to $85°$ and less than or equal to $95°$ is also included.

In this specification and the like, the terms "identical", "same", "equal", "uniform", and the like used in describing calculation values and measurement values allow for a margin of error of ±20% unless otherwise specified.

In addition, a voltage refers to a potential difference between a certain potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that even a "semiconductor" has characteristics of an "insulator" when conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" described in this specification can be replaced with each other in some cases.

Furthermore, a "semiconductor" has characteristics of a "conductor" when conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high power supply voltage VDD (hereinafter, also simply referred to as "VDD", "H voltage", or "H") is a power supply voltage higher than a low power supply voltage VSS (hereinafter, also simply referred to as "VSS", "L voltage", or "L").

Furthermore, VSS is a power supply voltage lower than VDD. A ground voltage (hereinafter, also simply referred to as "GND" or "GND voltage") can be used as VDD or VSS. For example, in the case where VDD is a ground voltage, VSS is a voltage lower than the ground voltage, and in the case where VSS is a ground voltage, VDD is a voltage higher than the ground voltage.

In addition, in this specification and the like, a gate refers to part or the whole of a gate electrode and a gate wiring. A gate wiring refers to a wiring for electrically connecting at least one gate electrode of a transistor to another electrode or another wiring.

Furthermore, in this specification and the like, a source refers to part or all of a source region, a source electrode, or a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

Moreover, in this specification and the like, a drain refers to part or all of a drain region, a drain electrode, or a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the voltages of a wiring, an electrode and the like, "H" representing an H voltage or "L" representing an L voltage is sometimes written near the wiring, the electrode, and the like. In addition, enclosed "H" or "L" is sometimes written near a wiring, an electrode, and the like whose voltage changes. Moreover, a symbol "x" is sometimes written on a transistor in an off state.

Embodiment 1

A semiconductor device of one embodiment of the present invention is described with reference to drawings. FIG. 1 is a block diagram illustrating a configuration of a wireless transceiver 900, which is one kind of semiconductor device.

Note that the structure of the semiconductor device shown in this specification and the like is an example, and all of the components are not necessarily included. It is acceptable as long as the semiconductor device include necessary components among the components shown in this specification and the like. A component other than the components shown in this specification and the like may be included.

The wireless transceiver 900 includes a low noise amplifier 901 (LNA), a band pass filter 902 (BPF), a mixer 903 (MIX), a band pass filter 904, a demodulator 905 (DEM), a power amplifier 911 (PA), a band pass filter 912, a mixer 913, a band pass filter 914, a modulator 915 (MOD), a duplexer 921 (DUP), a local oscillator 922 (LO), and an antenna 931.

<Receiving>

A signal 941 transmitted from another semiconductor device, a base station, or the like is input to the low noise amplifier 901 as a receiving signal through the antenna 931 and the duplexer 921. The duplexer 921 has a function of transmitting and receiving a radio signal with one antenna.

The low noise amplifier 901 has a function of amplifying a weak receiving signal to a signal having intensity that can be processed by the wireless transceiver 900. The signal 941 amplified by the low noise amplifier 901 is supplied to the mixer 903 through the band pass filter 902.

The band pass filter 902 has a function of attenuating frequency components outside a required frequency band among frequency components included in the signal 941 and transmitting the required frequency band.

The mixer 903 has a function of mixing the signal 941 transmitted through the band pass filter 902 and a signal 943 generated in the local oscillator 922 by a superheterodyne method. The mixer 903 mixes the signal 941 and the signal 943 and supplies a signal having a frequency component of a difference between them and a frequency component of the sum of them to the band pass filter 904.

The band pass filter 904 has a function of transmitting one frequency of the two frequency components. For example, the band pass filter 904 transmits the frequency component of the difference. Moreover, the band pass filter 904 also has a function of removing a noise component generated in the mixer 903. The signal transmitted through the band pass filter 904 is supplied to the demodulator 905. The demodulator 905 has a function of converting the supplied signal into a control signal, a data signal, or the like and outputting the control signal, the data signal, or the like. The signal output from the demodulator 905 is supplied to a variety of processing device (an arithmetic device, a memory device, or the like).

<Transmitting>

The modulator 915 has a function of generating a basic signal to transmit a control signal, a data signal, or the like from the wireless transceiver 900 to another semiconductor device, a base station, or the like. The basic signal is supplied to the mixer 913 through the band pass filter 914.

The band pass filter 914 has a function of removing a noise component generated when the basic signal is generated in the modulator 915.

The mixer 913 has a function of mixing the basic signal transmitted through the band pass filter 914 and a signal 944 generated in the local oscillator 922 by the superheterodyne method. The mixer 913 mixes the basic signal and the signal 944 and supplies a signal having a frequency component of a difference between them and a frequency component of the sum of them to the band pass filter 912.

The band pass filter 912 has a function of transmitting one frequency of the two frequency components. For example, the band pass filter 912 transmits the frequency component of the sum. Moreover, the band pass filter 912 also has a function of removing a noise component generated in the mixer 913. The signal transmitted through the band pass filter 912 is supplied to the power amplifier 911.

The power amplifier 911 has a function of amplifying a supplied signal to generate a signal 942. The signal 942 is radiated from the antenna 931 through the duplexer 921.

<Local Oscillator>

Figure 2:
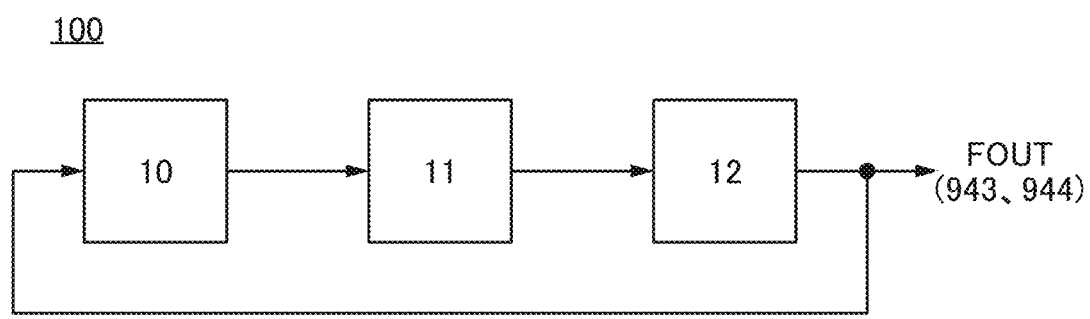
FIG. 2 is a block diagram illustrating a local oscillator.

FIG. 2 is a block diagram of a semiconductor device 100 that can be used for the local oscillator 922. The semiconductor device 100 includes a frequency voltage converter circuit 10, a loop filter 11, and a voltage control oscillator circuit 12.

The output of the frequency voltage converter circuit 10 is supplied to the loop filter 11. The output of the loop filter 11 is supplied to the voltage control oscillator circuit 12. The output of the voltage control oscillator circuit 12 is supplied to the frequency voltage converter circuit 10. Note that an output signal FOUT corresponds to the signal 943 supplied to the mixer 903 or the signal 944 supplied to the mixer 913 in FIG. 1.

The semiconductor device 100 generates a DC voltage from an input signal supplied to the frequency voltage converter circuit 10. The loop filter 11 removes frequency components included in the DC voltage. The DC voltage from which noise components are removed by the loop filter 11 is supplied to the voltage control oscillator circuit 12. The voltage control oscillator circuit 12 can change the oscillation frequency of the output signal FOUT in accordance with the voltage value of the input DC voltage. Moreover, the output signal FOUT is supplied to the frequency voltage converter circuit 10; accordingly, the semiconductor device 100 forms a feedback loop. Thus, the output signal FOUT can obtain stable oscillation frequency. Note that a low-pass filter can be used as the loop filter 11.

The frequency voltage converter circuit 10 preferably has a structure in which a change in an output voltage with respect to an input signal is small. As an example, the frequency voltage converter circuit 10 includes a switched capacitor, which is formed with a combination of a switch and a capacitor, in its structure. The switched capacitor can control current or voltage like a variable resistor. Unlike a resistor that releases electric power as heat, used power can be reduced and heat generation can be inhibited.

For example, as the switch, a transistor can be used. The semiconductor layer of the transistor preferably includes an oxide semiconductor. Note that a transistor including an oxide semiconductor (OS), which is one kind of metal oxide, in a semiconductor layer where a channel of the transistor is formed is referred to as an "OS transistor" or "OS-FET". Note that it is known that an OS transistor has a small change in electrical characteristics caused by temperature change. Moreover, it is known that a capacitor has a smaller change in electrical characteristics caused by temperature change than a resistor. Thus, a switched capacitor that is formed using the switch and the capacitor each of which has a small change in electrical characteristics caused by temperature change can reduce temperature dependence. Furthermore, in the OS transistor, the semiconductor layer has a large energy gap, and thus the OS transistor can have an extremely low off-state current of several yA/μm (a current value per micrometer of a channel width). Thus, the OS transistor can inhibit leakage from electric charge held in the capacitor. Therefore, an input signal supplied to the switched capacitor can be converted into a DC voltage efficiently while a loss due to leakage is reduced.

Figure 3A:
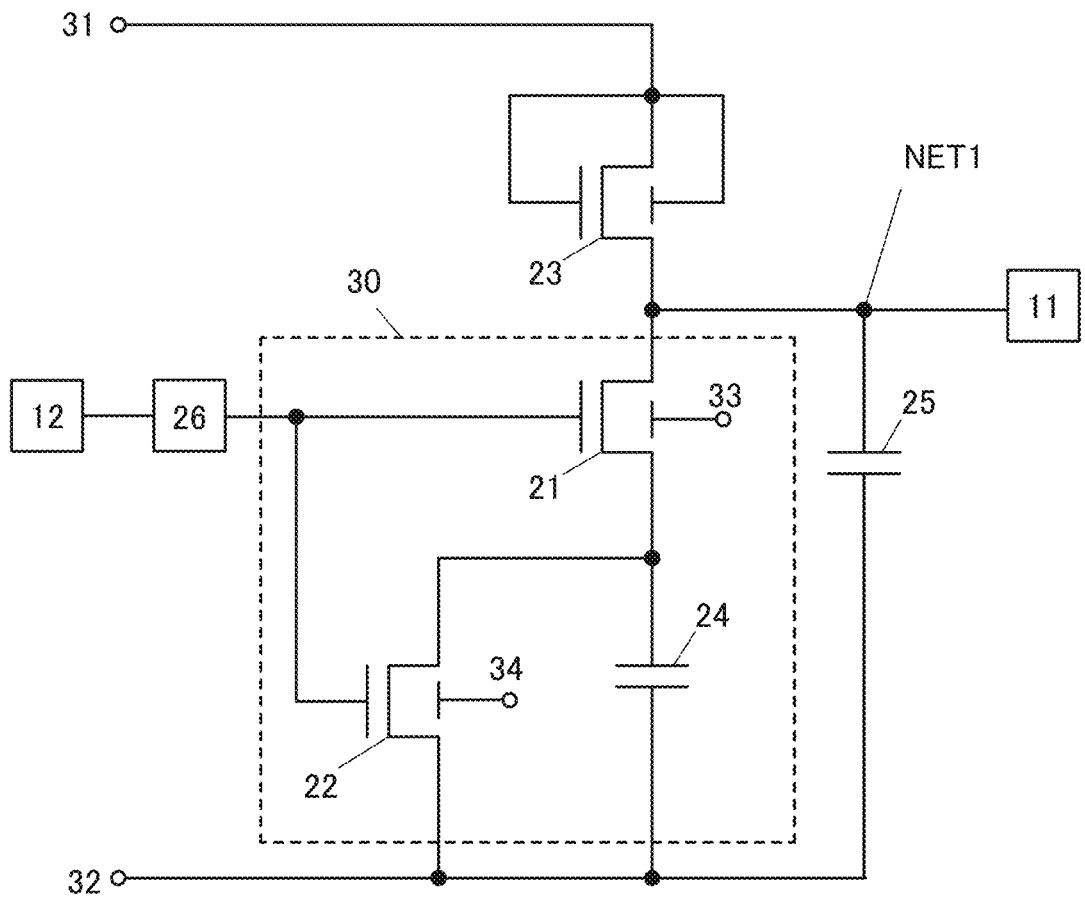
FIG. 3A to FIG. 3C are circuit diagrams illustrating a semiconductor device.
Figure 3B:
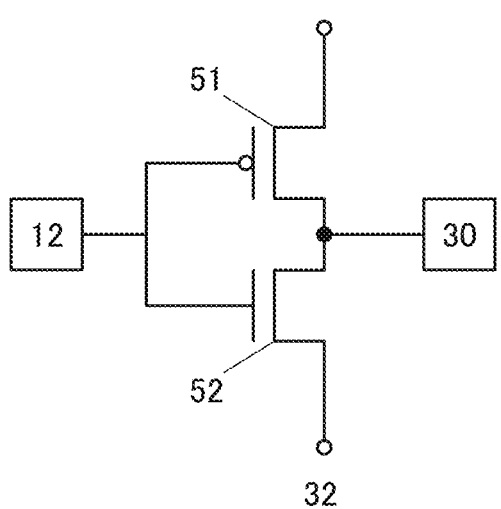
Figure 3C:
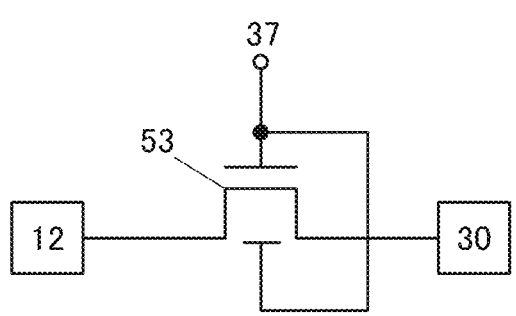

FIG. 3A is a circuit diagram illustrating the frequency voltage converter circuit 10. FIG. 3B and FIG. 3C are diagrams illustrating a functional element 26.

First, the frequency voltage converter circuit 10 is described with reference to FIG. 3A. The frequency voltage converter circuit 10 includes a transistor 21, a transistor 22, a transistor 23, a capacitor 24, a capacitor 25, and the functional element 26.

One electrode of the functional element 26 is electrically connected to the voltage control oscillator circuit 12. The other electrode of the functional element 26 is electrically connected to a gate of the transistor 21 and a gate of the transistor 22. One of a source and a drain of the transistor 21 is electrically connected to one of a source and a drain of the transistor 22 and one electrode of the capacitor 24. The other of the source and the drain of the transistor 21 is electrically connected to one of a source and a drain of the transistor 23, one electrode of the capacitor 25, and the loop filter 11. A wiring 31 is electrically connected to the other of the source and the drain of the transistor 23 and a gate and a back gate of the transistor 23. A wiring 32 is electrically connected to the other of the source and the drain of the transistor 22, the other electrode of the capacitor 24, and the other electrode of the capacitor 25. A wiring 33 is electrically connected to a back gate of the transistor 21. A wiring 34 is electrically connected to a back gate of the transistor 22. Hereinafter, the one electrode of the capacitor 25 is referred to as a node NET1.

Note that the transistor 21 to the transistor 23 are OS transistors. The transistor 21, the transistor 22, and the capacitor 24 function as a switched capacitor 30. Note that a power supply voltage of the semiconductor device 100 is supplied to the wiring 31, and a ground voltage of the semiconductor device 100 is supplied to the wiring 32.

Next, one embodiment of the functional element 26 is described with reference to FIG. 3B. As an example, the functional element 26 illustrated in FIG. 3B has a function of a buffer. An inverter circuit can be used for the buffer. The inverter circuit includes a p-channel transistor 51 and an n-channel transistor 52. Note that operation of the inverter circuit is omitted.

The voltage control oscillator circuit 12 is electrically connected to a gate of the transistor 51 and a gate of the transistor 52. One of a source and a drain of the transistor 51 is electrically connected to the wiring 31. The other of the source and the drain of the transistor 51 is electrically connected to one of a source and a drain of the transistor 52 and the switched capacitor 30. The other of the source and the drain of the transistor 52 is electrically connected to the wiring 32.

Next, the functional element 26 that is different from that in FIG. 3B is described with reference to FIG. 3C. As an example, the functional element 26 illustrated in FIG. 3C includes a transistor 53 functioning as a transfer gate. An OS transistor can be used as the transistor 53. The OS transistor can inhibit influence on the voltage control oscillator circuit 12 caused when a signal which charges the gate capacitance of the transistor 21 and the transistor 22 which are included in the switched capacitor 30 becomes a reflected wave. The reduction of generation of the reflected wave enables the voltage control oscillator circuit 12 to output an excellent oscillation frequency having a low jitter component. Note that a control signal that brings the transistor 53 into an on state or an off state is supplied to a wiring 37.

Description is made with reference to FIG. 3A again. As an example, in the case where a first voltage is supplied to the wiring 33 and the wiring 34, the threshold voltages of the transistor 21 and the transistor 22 are changed. In the case where the first voltage becomes low, the threshold voltages of the transistor 21 and the transistor 22 shift to the positive side. In the case where the first voltage becomes high, the threshold voltages of the transistor 21 and the transistor 22 shift to the negative side.

Thus, in the case where the first voltage becomes low, the voltage of the node NET1 becomes high. This is because a smaller amount of the electric charge held in the capacitor 24 is discharged through the transistor 22. Note that the voltage of the node NET1 is determined by the impedance ratio between the switched capacitor 30 and the diode-connected transistor 23.

As a different example, in the case where the first voltage becomes high, the voltage of the node NET1 becomes low. This is because a larger amount of the electric charge held in the capacitor 24 is discharged through the transistor 22. Note that the voltage of the node NET1 is determined by the impedance ratio between the switched capacitor 30 and the diode-connected transistor 23.

Note that the voltage supplied to the wiring 33 and the voltage supplied to the wiring 34 may be different. For example, the voltage supplied to the wiring 33 controls the threshold voltage of the transistor 21. Thus, the amount of electric charge that is injected to the capacitor 24 through the transistor 21 can be controlled. Furthermore, the voltage supplied to the wiring 34 controls the threshold voltage of the transistor 22. Thus, the amount of electric charge that is discharged from the capacitor 24 through the transistor 22 can be controlled. In the case where the transistor 21 operates with a threshold voltage different from that of the transistor 22, the voltage of the node NET1 can be controlled finely.

A reduction of an effect of temperature change in the frequency voltage converter circuit 10 enables the wireless transceiver 900 to receive and transmit signals stably.

Figure 4A:
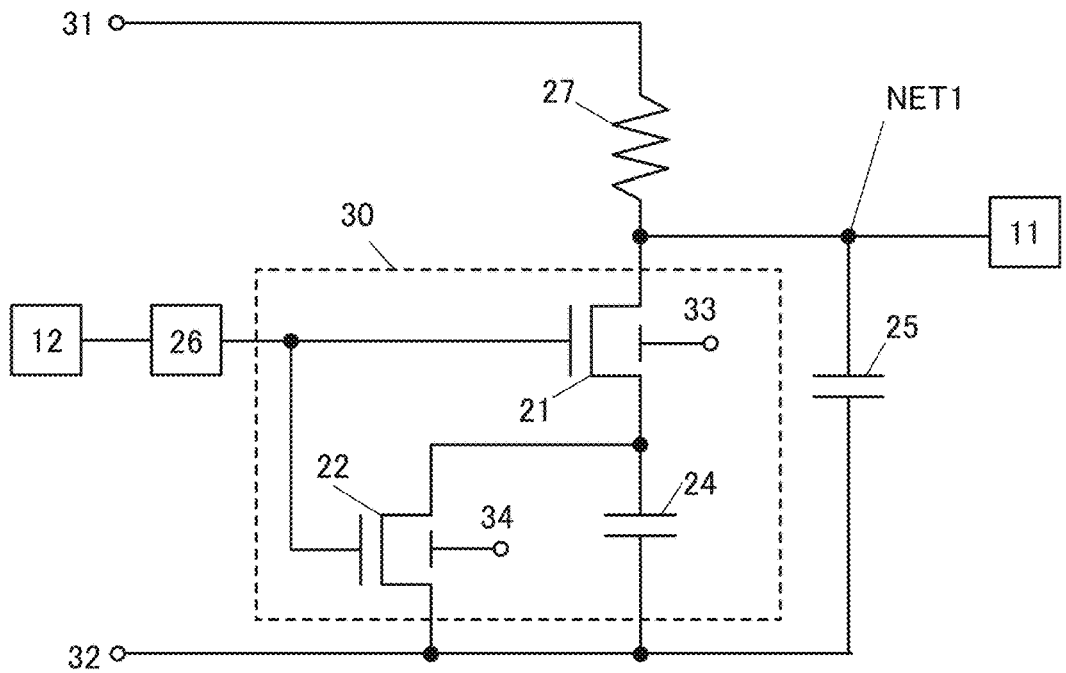
FIG. 4A and FIG. 4B are circuit diagrams illustrating semiconductor devices.
Figure 4B:
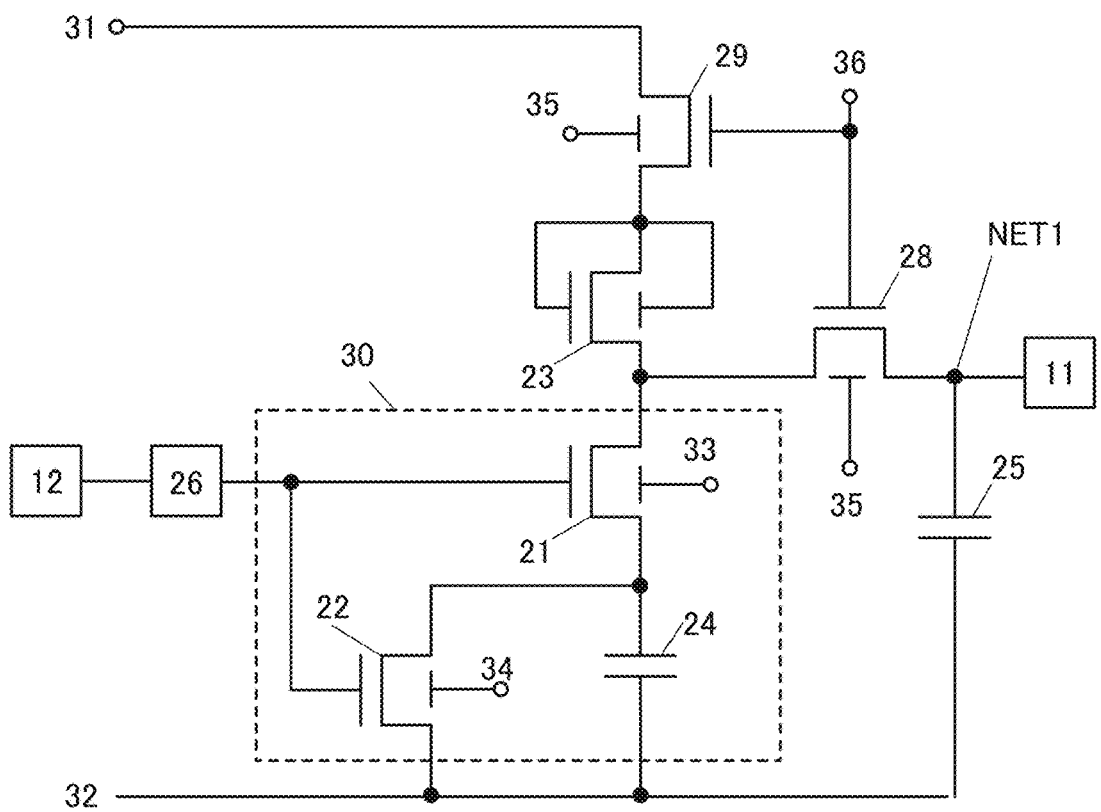

FIG. 4A and FIG. 4B are circuit diagrams illustrating the frequency voltage converter circuit 10 that is different from FIG. 3. Note that in the structures of the invention described below, the same portions or portions having similar functions are denoted by the same reference numerals in different drawings, and description thereof is not repeated.

FIG. 4A is different from FIG. 3 in that a resistor 27 is included. One of the resistor 27 is electrically connected to the wiring 31. The other of the resistor 27 is electrically connected to the other of the source and the drain of the transistor 21, the one electrode of the capacitor 25, and the loop filter 11.

In the frequency voltage converter circuit 10 illustrated in FIG. 4A, the voltage of the node NET1 is determined by the impedance ratio between the resistor 27 and the switched capacitor. Thus, the voltage of the node NET1 can be kept linearly using the resistor 27.

FIG. 4B is different from FIG. 3 in that a transistor 28 and a transistor 29 are included. A gate of the transistor 28 is electrically connected to a gate of the transistor 29 and a wiring 36. One of a source and a drain of the transistor 28 is electrically connected to the one of the source and the drain of the transistor 23 and the other of the source and the drain of the transistor 21. The other of the source and the drain of the transistor 28 is electrically connected to the one electrode of the capacitor 25 and the loop filter 11. One of a source and a drain of the transistor 29 is electrically connected to the wiring 31. The other of the source and the drain of the transistor 29 is electrically connected to the other of the source and the drain of the transistor 23 and the gate and the back gate of the transistor 23.

In the frequency voltage converter circuit 10 illustrated in FIG. 4B, the node NET1 can be isolated from the switched capacitor by the transistor 28. An OS transistor having a low off-state current is preferably used as the transistor 28. The use of the OS transistor as the transistor 28 can inhibit deterioration of a value of the voltage held in the capacitor 25, that is, the node NET1.

In the case where the semiconductor device 100 is brought into a low power mode, the transistor 28 is brought into an off state, so that the frequency voltage converter circuit 10 can be brought into the low power mode. Note that the on state and off state of the transistor 28 are controlled by a signal supplied to the wiring 36.

Note that the output signal FOUT is supplied from the voltage control oscillator circuit 12 to the functional element 26 even in the low power mode. Thus, the switched capacitor 30 consumes power. As its measure, in the case where the frequency voltage converter circuit 10 is brought into the low power mode, the frequency voltage converter circuit 10 stops supply of current to the switched capacitor 30, so that the operation of the switched capacitor 30 is stopped and thus power consumption is reduced.

As an example, the transistor 29 is provided between the wiring 31 and the transistor 23. The on state and off state of the transistor 29 are preferably controlled at the same time as the transistor 28. When the transistor 28 and the transistor 29 are brought into an off state at the same time, the voltage of the node NET1 is held, so that the semiconductor device 100 outputs the stable output signal FOUT. Even when the output signal FOUT is supplied to the switched capacitor 30 through the functional element 26, since the transistor 29 is in an off state, the operation of the switched capacitor 30 is stopped. Thus, the semiconductor device 100 outputs the stable output signal FOUT even in the case where the frequency voltage converter circuit 10 is brought into the low power mode.

Figure 5A:
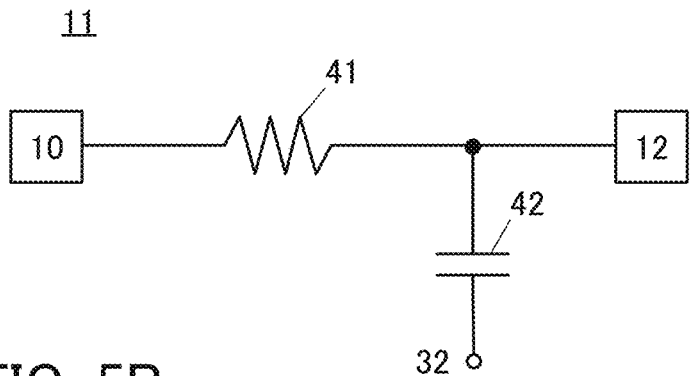
FIG. 5A to FIG. 5C are circuit diagrams illustrating semiconductor devices.
Figure 5B:
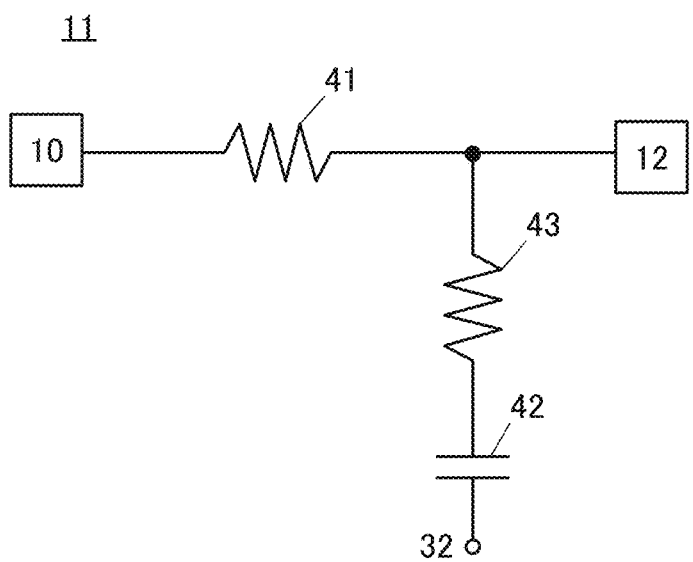
Figure 5C:
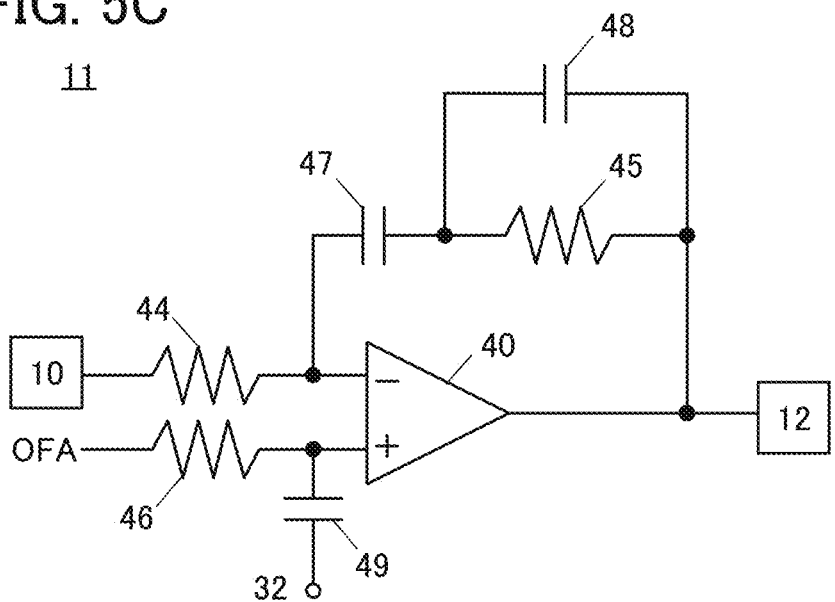

FIG. 5A, FIG. 5B, and FIG. 5C are circuit diagrams illustrating the loop filter 11. The loop filter 11 illustrated in FIG. 5A is a primary low-pass filter formed of a resistor 41 and a capacitor 42.

The output of the frequency voltage converter circuit 10 is supplied to one electrode of the resistor 41. The other electrode of the resistor 41 is electrically connected to one electrode of the capacitor 42 and the voltage control oscillator circuit 12. The other electrode of the capacitor 42 is electrically connected to the wiring 32. Note that a ground voltage is supplied to the wiring 32.

FIG. 5B shows a low-pass filter that is different from that of FIG. 5A in that a resistor 43 is further included. The loop filter 11 illustrated in FIG. 5B is an example of a secondary low-pass filter. The feature of the secondary low-pass filter is that a phase of an input signal that is delayed once is returned again by the low-pass filter.

The output of the frequency voltage converter circuit 10 is electrically connected to the one electrode of the resistor 41. The other electrode of the resistor 41 is electrically connected to one electrode of the resistor 43 and the voltage control oscillator circuit 12. The other electrode of the resistor 43 is electrically connected to the one electrode of the capacitor 42. The other electrode of the capacitor 42 is electrically connected to the wiring 32. Note that a ground voltage is supplied to the wiring 32.

FIG. 5C is a circuit diagram illustrating the loop filter 11 using an operational amplifier. The loop filter 11 illustrated in FIG. 5C is a low-pass filter including a terminal OFA to which a voltage for offset adjustment that finely adjust phases is supplied is included and having an improved ripple rejection characteristic.

The loop filter 11 illustrated in FIG. 5C includes an operational amplifier 40, a resistor 44, a resistor 45, a resistor 46, a capacitor 47, a capacitor 48, and a capacitor 49. Note that the operational amplifier 40 includes an inverting input terminal, a non-inverting input terminal, and an output terminal.

The output of the frequency voltage converter circuit 10 is electrically connected to one electrode of the resistor 44. The other electrode of the resistor 44 is electrically connected to the inverting input terminal of the operational amplifier 40 and one electrode of the capacitor 47. The other electrode of the capacitor 47 is electrically connected to one electrode of the resistor 45 and one electrode of the capacitor 48. The output terminal of the operational amplifier 40 is electrically connected to the other electrode of the resistor 45, the other electrode of the capacitor 48, and the voltage control oscillator circuit 12. The terminal OFA is electrically connected to one electrode of the resistor 46. The other electrode of the resistor 46 is electrically connected to one electrode of the capacitor 49 and the non-inverting input terminal of the operational amplifier 40. The other electrode of the capacitor 49 is electrically connected to the wiring 32. Note that a ground voltage is supplied to the wiring 32.

Figure 6:
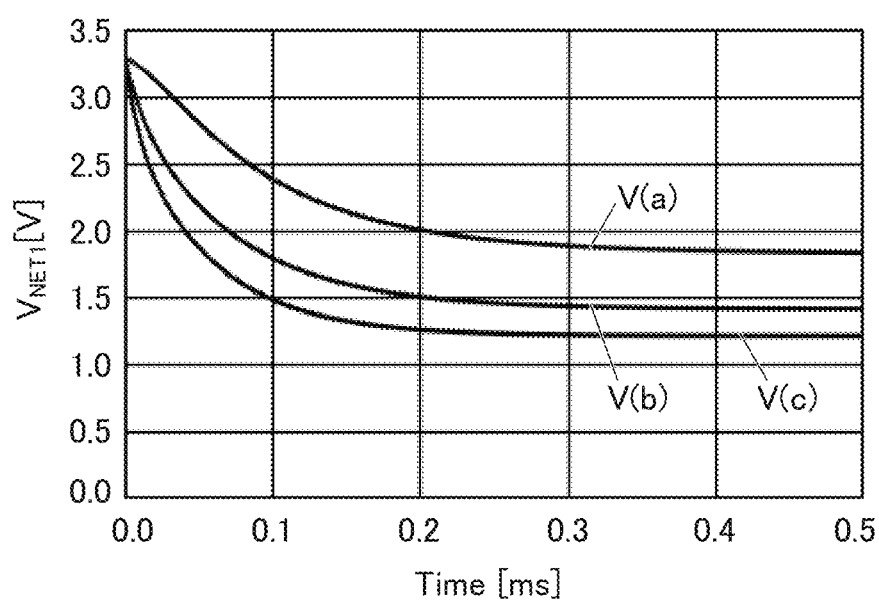
FIG. 6 is a diagram showing output characteristics of a semiconductor device.

FIG. 6 is a graph showing the change of the potential of the node NET1 in the case where the output signal FOUT with a constant frequency is supplied to the frequency voltage converter circuit 10. The vertical axis represents a change in the potential ($V_{NET1}$) of the node NET1, and the horizontal axis represents passage of time (Time).

A property V(a) is a change of $V_{NET1}$ in the case where −10 V is supplied to the back gates of the transistor 21 and the transistor 22. A property V(b) is a change of $V_{NET1}$ in the case where −5 V is supplied to the back gates of the transistor 21 and the transistor 22. A property V(c) is a change of $V_{NET1}$ in the case where 0 V is supplied to the back gates of the transistor 21 and the transistor 22.

Thus, the level of the voltage applied to the node NET1 can be controlled in accordance with the voltage supplied to the back gates of the transistor 21 and the transistor 22 included in the switched capacitor 30 in the frequency voltage converter circuit 10. In other words, the oscillation frequency of the output signal FOUT of the semiconductor device 100 can be adjusted by the voltage supplied to the back gates of the transistor 21 and the transistor 22. Moreover, the frequency voltage converter circuit 10 has a feature of being less likely to be affected by a change in temperature characteristics, owing to the use of an OS transistor.

For example, an IC (or an integrated circuit) that uses signals having a high frequency band such as 5G easily generates heat. In the case where an IC or the like that generates heat exists in the surrounding area, the temperature change is converted into a voltage, and the voltage is supplied to the back gates of the transistor 21 and the transistor 22, so that the oscillation frequency can be adjusted. Thus, the wireless transceiver can receive and transmit data correctly.

Note that the semiconductor device of one embodiment of the present invention is not limited to be used for the wireless transceiver. The semiconductor device of one embodiment of the present invention can be used for industrial devices such as robotics, in-vehicle devices, drones, or manufacturing equipment.

Here, a memory element using an OS transistor is described. As an example, it can be said that the frequency voltage converter circuit 10 illustrated in FIG. 4B has a structure of a memory element formed of the transistor 28 and the capacitor 25. In particular, in the case where the OS transistor is used as the transistor 28, the memory element can be referred to as an "OS memory".

The OS memory can hold written data in a period of one year or longer, or even 10 years or longer after power supply is stopped. Thus, the OS memory can be regarded as a nonvolatile memory.

Furthermore, an OS memory employs a method in which charge is written to a node through the OS transistor; hence, high voltage, which a conventional flash memory requires, is unnecessary and a high-speed writing operation is possible. Furthermore, the number of data writing and reading in an OS memory is substantially unlimited because charge injection and extraction into/from a floating gate or a charge trap layer are not performed. An OS memory is less likely to degrade than a conventional flash memory and can have high reliability.

Unlike a magnetic memory, a resistive random access memory, or the like, an OS memory has no change in the structure at the atomic level. Thus, an OS memory has higher rewrite endurance than a magnetic memory and a resistive random access memory.

When the OS memory is provided in the previous stage of the loop filter 11, constant supply of a voltage to the loop filter 11 is not required. Thus, the power consumption of the semiconductor device 100 can be reduced.

The off-state current of the OS transistor hardly increases even in a high temperature environment. Specifically, the off-state current hardly increases even at an environment temperature higher than or equal to room temperature and lower than or equal to 200° C. In addition, the on-state current of the OS transistor is unlikely to decrease even in high-temperature environments. An OS transistor has high withstand voltage between its source and drain. When OS transistors are used as transistors included in a semiconductor device, the semiconductor device achieves stable operation and high reliability even in a high-temperature environment.

Here, a back gate of an OS transistor is described. The back gate is placed so that a channel formation region of a semiconductor layer is sandwiched between the gate and the back gate. The back gate can function in a manner similar to that of the gate. By changing the voltage of the back gate, the threshold voltage of the transistor can be changed. The voltage of the back gate may be the same as that of the gate or may be a GND voltage or a given voltage.

In addition, in general, the gate and the back gate are formed using conductive layers and thus each have a function of preventing an electric field generated outside the transistor from influencing the semiconductor layer in which a channel is formed (particularly, a function of preventing static electricity). That is, variation in the electrical characteristics of the transistor due to the influence of an external electric field such as static electricity can be prevented.

The composition, structure, method, and the like described above in this embodiment can be used in combination as appropriate with the compositions, structures, methods, and the like described in the other embodiments, the example, and the like.

Embodiment 2

In this embodiment, structures of transistors that can be used in the semiconductor device described in the above embodiments are described. As an example, a configuration in which transistors having different electrical characteristics are stacked is described. With the structure, the degree of freedom in design of the semiconductor device can be increased. Stacking transistors having different electrical characteristics can increase the degree of integration of the semiconductor device.

Figure 7:
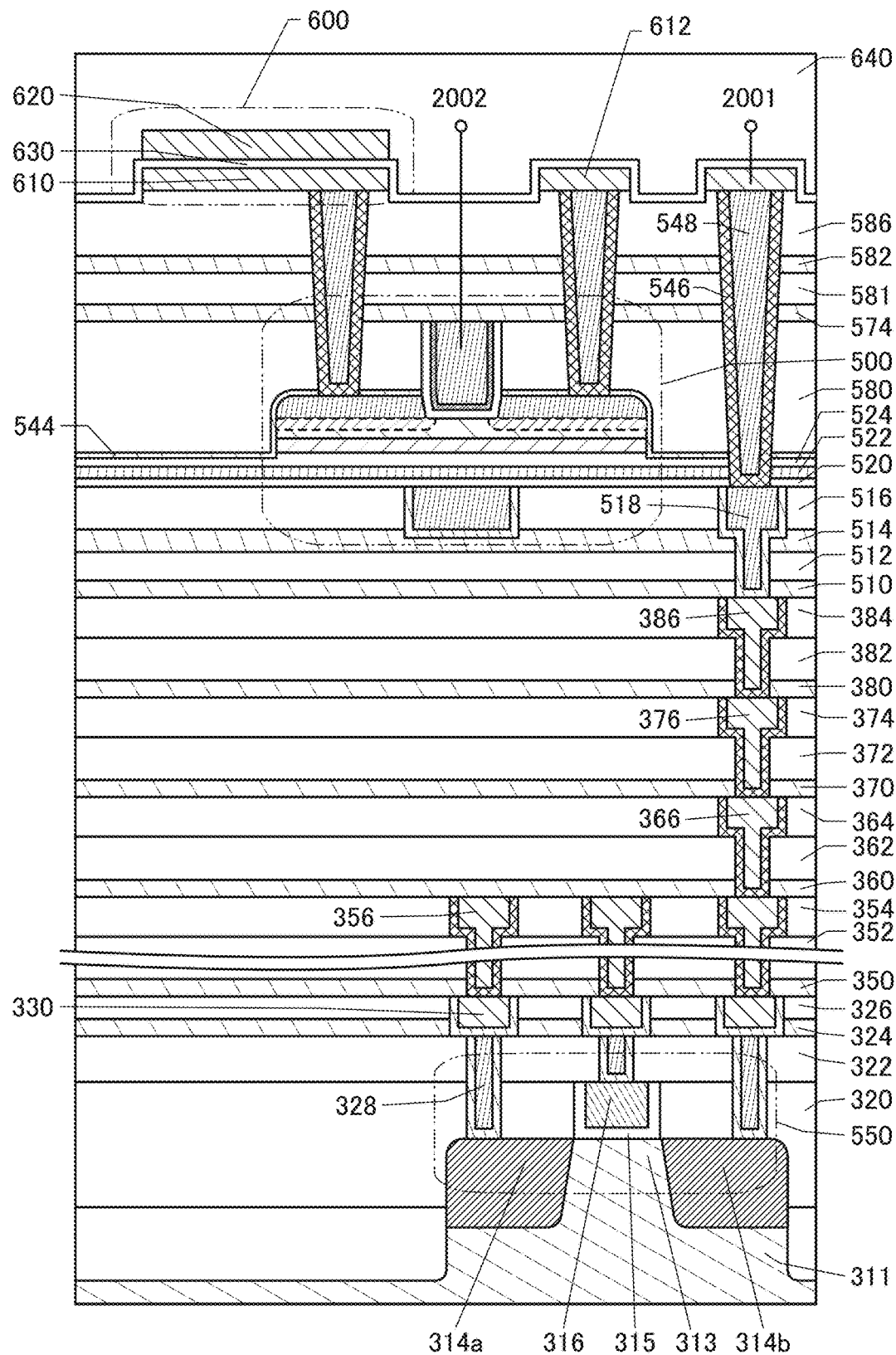
FIG. 7 is a diagram showing a structure example of a semiconductor device.
Figure 9A:
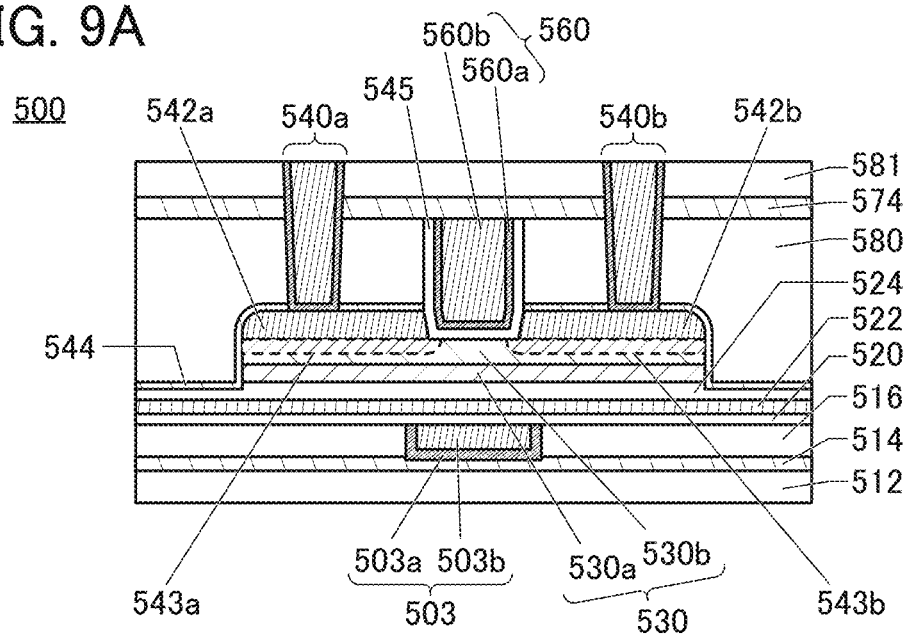
FIG. 9A to FIG. 9C are diagrams showing a transistor structure example.
Figure 9B:
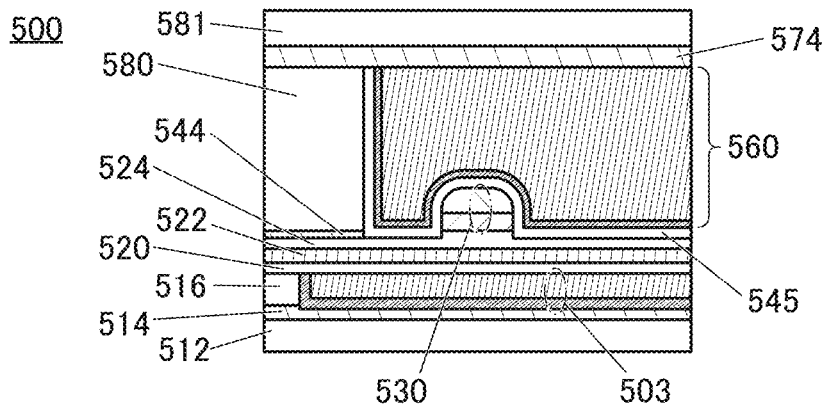
Figure 9C:
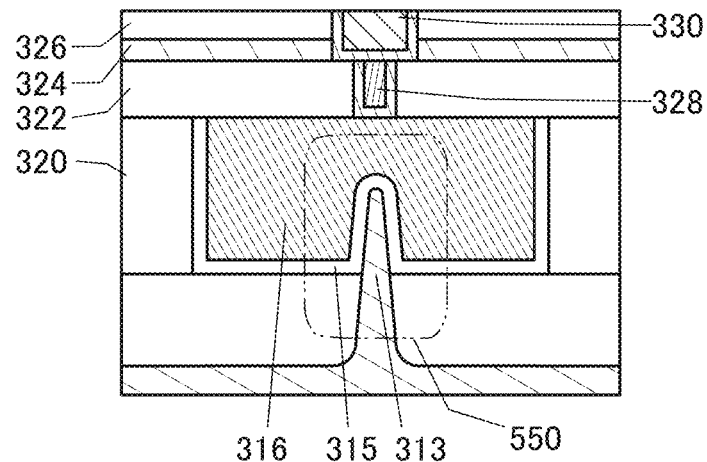

FIG. 7 shows part of a cross-sectional structure of a semiconductor device. A semiconductor device shown in FIG. 7 includes a transistor 550, a transistor 500, and a capacitor 600. FIG. 9A is a cross-sectional view of the transistor 500 in the channel length direction, FIG. 9B is a cross-sectional view of the transistor 500 in the channel width direction, and FIG. 9C is a cross-sectional view of the transistor 550 in the channel width direction. For example, the transistor 500 and the transistor 550 correspond to the transistor 21 and the transistor 22, respectively, described in the above embodiment. The capacitor 600 corresponds to the capacitor 24. Note that a wiring 2001 can be connected to a wiring 2002.

The transistor 500 is an OS transistor. The transistor 500 has extremely low off-state current. Accordingly, data voltage or charge written to a storage node through the transistor 500 can be retained for a long time. In other words, power consumption of the semiconductor device can be reduced because a memory node has a low frequency of refresh operation or requires no refresh operation.

In FIG. 7, the transistor 500 is provided above the transistor 550, and the capacitor 600 is provided above the transistor 550 and the transistor 500.

The transistor 550 is provided over a substrate 311 and includes a conductor 316, an insulator 315, a semiconductor region 313 that is part of the substrate 311, and a low-resistance region 314a and a low-resistance region 314b each functioning as a source region or a drain region.

As shown in FIG. 9C, in the transistor 550, a top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (Silicon on Insulator) substrate, for example.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by thermal treatment; an ELTRAN method (a registered trademark: Epitaxial Layer Transfer); or the like. A transistor formed using a single crystal substrate contains a single crystal semiconductor in a channel formation region.

Figure 8:
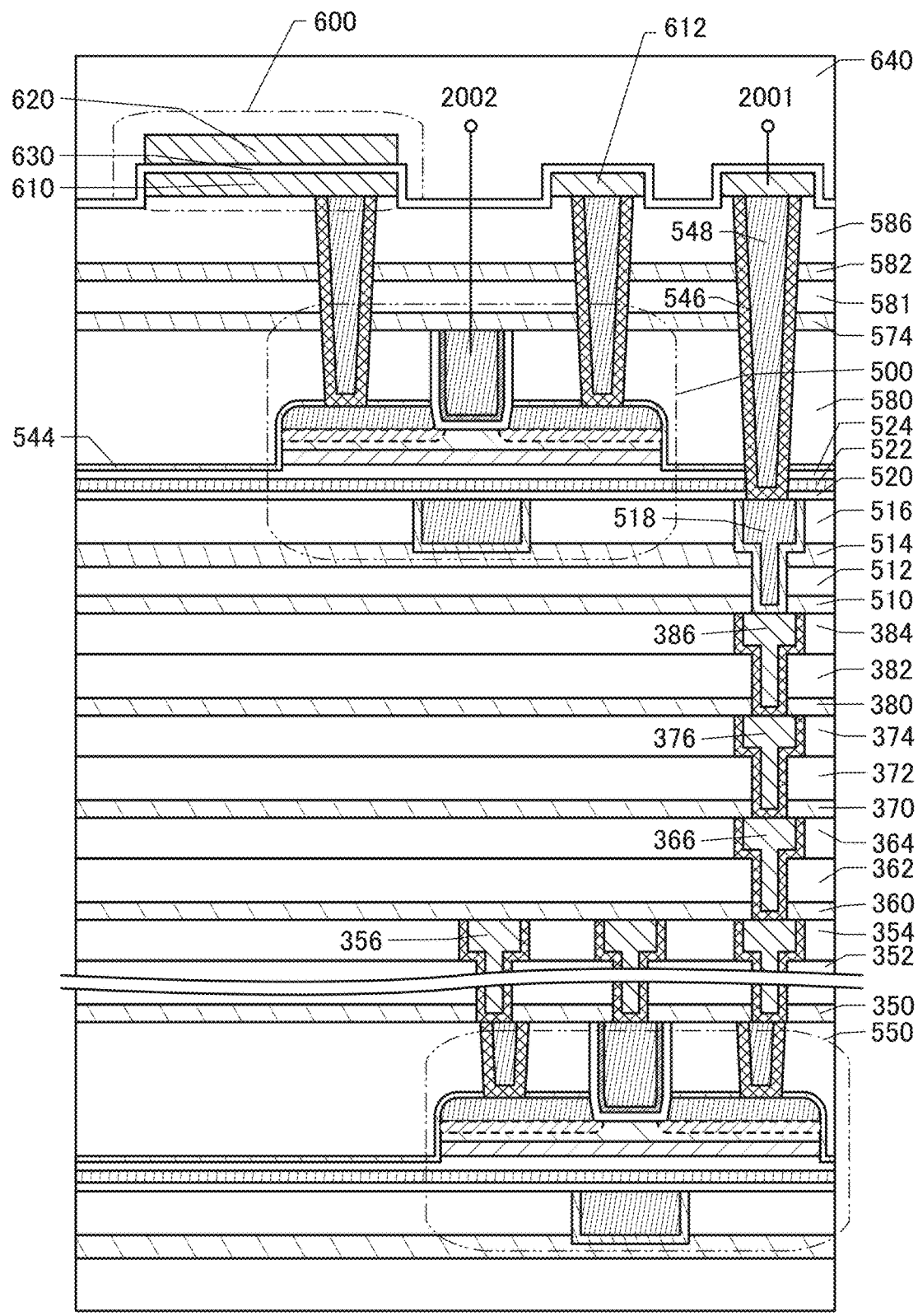
FIG. 8 is a diagram showing a structure example of a semiconductor device.

Note that the transistor 550 shown in FIG. 7 is an example and the configuration is not limited thereto; an appropriate transistor can be used in accordance with a circuit configuration or a driving method. For example, when the semiconductor device is a single-polarity circuit using only OS transistors (which represent transistors having the same polarity, e.g., only n-channel transistors), the transistor 550 has a structure similar to that of the transistor 500 using an oxide semiconductor, as illustrated in FIG. 8. Note that the details of the transistor 500 are described later.

An insulator 320, an insulator 322, an insulator 324, and an insulator 326 are stacked sequentially to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed using a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 7, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a configuration in which a tantalum nitride layer having a barrier property against hydrogen is in contact with the insulator 350 having a barrier property against hydrogen is preferable.

A wiring layer may be provided over the insulator 354 and the conductor 356. For example, in FIG. 7, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 7, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 7, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 550 is provided, or the like into the region where the transistor 500 is provided. Therefore, a material similar to that for the insulator 324 can be used.

For the film having a barrier property against hydrogen, silicon nitride formed using a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As shown in FIG. 9A and FIG. 9B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom and a side surface of the opening; and a conductor 560 positioned on a formation surface of the insulator 545.

As illustrated in FIG. 9A and FIG. 9B, an insulator 544 is preferably positioned between the insulator 580 and the oxide 530a, the oxide 530b, the conductor 542a, and the conductor 542b. Furthermore, as shown in FIG. 9A and FIG. 9B, the conductor 560 preferably includes a conductor 560a provided on the inner side of the insulator 545 and a conductor 560b provided to be embedded on the inner side of the conductor 560a. Moreover, as shown in FIG. 9A and FIG. 9B, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is shown, the present invention is not limited thereto. For example, a single layer of the oxide 530b or a stacked-layer structure of three or more layers may be used.

Furthermore, although the conductor 560 is shown to have a stacked-layer structure of two layers in the transistor 500, the present invention is not limited thereto. For example, the conductor 560 may have a single-layer structure or a stacked-layer structure of three or more layers. Moreover, the transistor 500 illustrated in FIG. 7, FIG. 8, and FIG. 9A is an example and the structure is not limited thereto; an appropriate transistor is used in accordance with a circuit structure or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a voltage applied to the conductor 503 independently of a voltage applied to the conductor 560. In particular, the threshold voltage of the transistor 500 can be higher than 0 V and the off-state current can be reduced by applying a negative voltage to the conductor 503. Thus, a drain current at the time when a voltage applied to the conductor 560 is 0 V can be lower in the case where a negative voltage is applied to the conductor 503 than in the case where a negative voltage is not applied to the conductor 503.

The conductor 503 is positioned to overlap with the oxide 530 and the conductor 560. Thus, in the case where voltages are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. Furthermore, in this specification and the like, the surrounded channel (S-channel) structure has a feature in that the side surface and the vicinity of the oxide 530 that is in contact with the conductor 542a and the conductor 542b functioning as a source electrode and a drain electrode are of I-type like the channel formation region. Since the side surface and the vicinity of the oxide 530 that is in contact with the conductor 542a and the conductor 542b are in contact with the insulator 544, they can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 has a stacked layer of the conductor 503a and the conductor 503b in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as "excess oxygen". That is, a region containing excess oxygen (also referred to as an excess-oxygen region) is preferably formed in the insulator 524. When such an insulator containing excess oxygen is provided in contact with the oxide 530, oxygen vacancies ($V_o$) in the oxide 530 can be reduced and the reliability of the transistor 500 can be improved. When hydrogen enters the oxygen vacancies in the oxide 530, such defects (hereinafter, referred to as $V_O H$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, $V_O H$ in the oxide 530 is preferably reduced as much as possible so that the oxide 530 becomes a highly purified intrinsic or substantially highly purified intrinsic oxide. It is effective to remove impurities such as moisture and hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose $V_O H$ is sufficiently reduced. When an oxide semiconductor with sufficiently reduced impurities such as $V_O H$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_O H$ is cut occurs, i.e., a reaction of $V_O H \rightarrow V_O + H$ occurs. Part of hydrogen generated at this time is bonded to oxygen to be $H_2O$, and removed from the oxide 530 or an insulator near the oxide 530 in some cases. Some hydrogen may be gettered into the conductor 542a and/or the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of $V_O+O \rightarrow null$. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate voltage during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, when an insulator that is a high-k material is combined with silicon oxide or silicon oxynitride, the insulator 520 having a stacked-layer structure that has thermal stability and a high relative permittivity can be obtained.

Note that in the transistor 500 in FIG. 9A and FIG. 9B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. Note that the oxide semiconductor preferably contains at least one of In and Zn. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

The metal oxide functioning as the channel formation region in the oxide 530 has a band gap of preferably 2 eV or higher, further preferably 2.5 eV or higher. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gently changes at a junction portion of the oxide 530a and the oxide 530b. In other words, the energy level of the conduction band minimum at the junction portion of the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is used as the oxide 530a.

At this time, the oxide 530b serves as a main carrier path. When the oxide 530a has the above-described structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 9A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as shown in FIG. 9A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 to the conductor 560. Providing the metal oxide that inhibits diffusion of oxygen inhibits diffusion of excess oxygen from the insulator 545 to the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 that functions as the first gate electrode and has a two-layer structure is shown in FIG. 9A and FIG. 9B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited using a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that are described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and a SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, an aramid resin, an epoxy resin, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack-layer structure of a tungsten film and a silicon oxide film that are inorganic films, a structure in which an organic resin film of polyimide or the like is formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

<Modification Example 1 of Transistor>

Figure 10A:
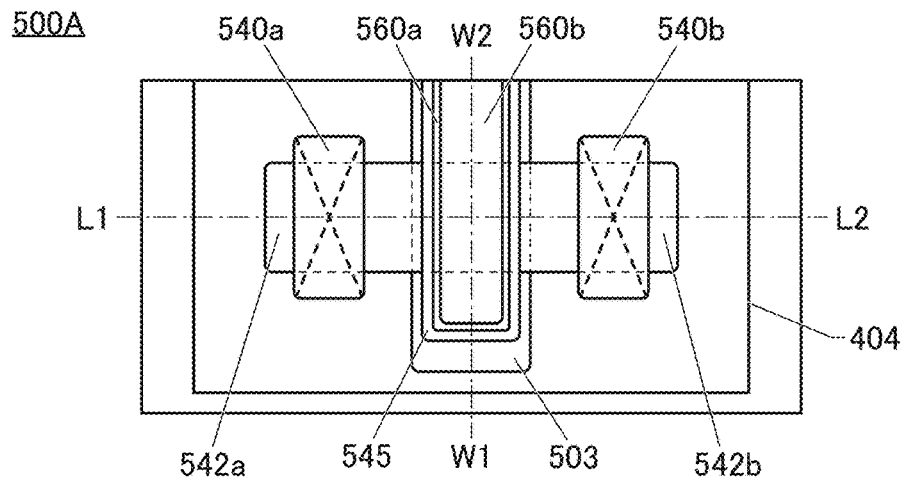
FIG. 10A to FIG. 10C are diagrams showing a transistor structure example.
Figure 10B:
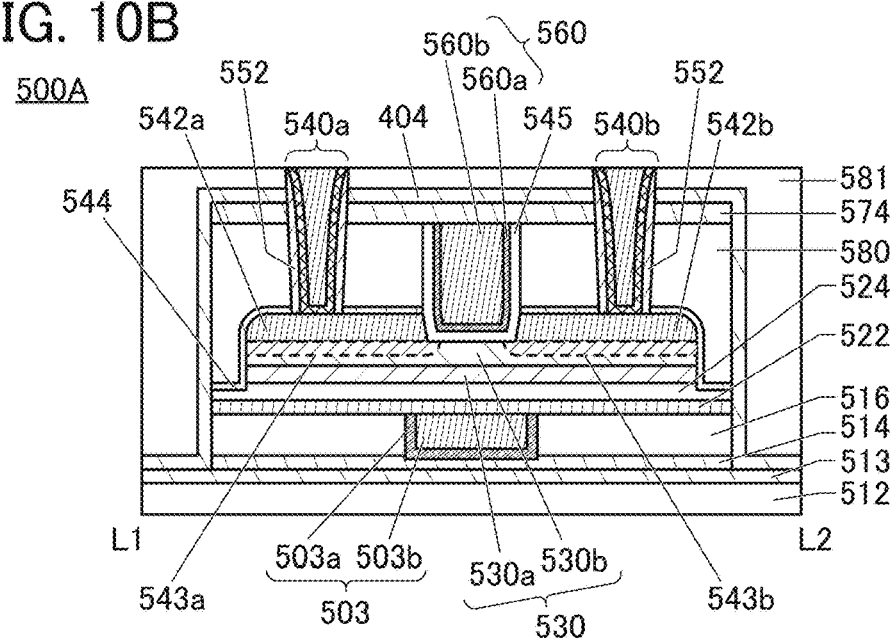
Figure 10C:
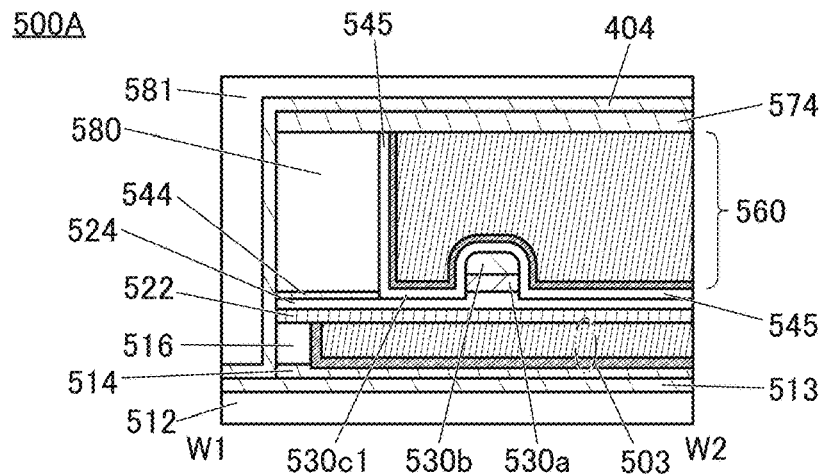

A transistor 500A illustrated in FIG. 10A, FIG. 10B, and FIG. 10C is a modification example of the transistor 500 having the structure shown in FIG. 9A and FIG. 9B. FIG. 10A is a top view of the transistor 500A. FIG. 10B is a cross-sectional view taken along the dashed-dotted line L1-L2 in FIG. 10A, that is, a cross-sectional view of the transistor 500A in the channel length direction, and FIG. 10C is a cross-sectional view taken along the dashed-dotted line W1-W2 in FIG. 10A, that is, a cross-sectional view of the transistor 500A in the channel width direction. Note that the structure shown in FIG. 10A, FIG. 10B, and FIG. 10C can also be used for other transistors such as the transistor 550 included in the semiconductor device of one embodiment of the present invention.

The transistor 500A having the structure illustrated in FIG. 10A, FIG. 10B, and FIG. 10C is different from the transistor 500 having the structure illustrated in FIG. 9A and FIG. 9B in that an insulator 552, an insulator 513, and an insulator 404 are included. Furthermore, the transistor 500A having the structure shown in FIG. 10A, FIG. 10B, and FIG. 10C is different from the transistor 500 having the structure shown in FIG. 9A and FIG. 9B in that the insulator 552 is provided in contact with a side surface of the conductor 540a and a side surface of the conductor 540b. Moreover, the transistor 500A having the structure shown in FIG. 10A, FIG. 10B, and FIG. 10C is different from the transistor 500 having the structure shown in FIG. 9A and FIG. 9B in that the insulator 520 is not included.

In the transistor 500 having the structure shown in FIG. 10A, FIG. 10B, and FIG. 10C, the insulator 513 is provided over the insulator 512. The insulator 404 is provided over the insulator 574 and the insulator 513.

In the transistor 500 having the structure shown in FIG. 10A, FIG. 10B, and FIG. 10C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride as the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

<Modification Example 2 of Transistor>

Figure 11A:
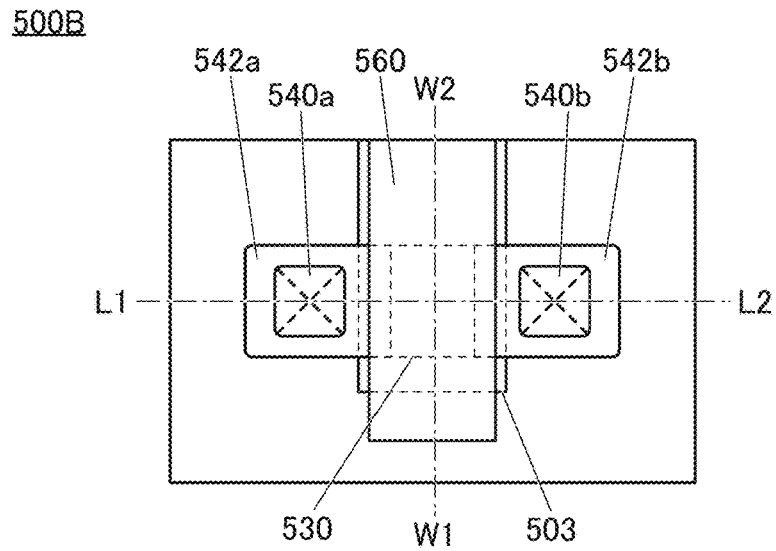
FIG. 11A to FIG. 11C are diagrams showing a transistor structure example.
Figure 11B:
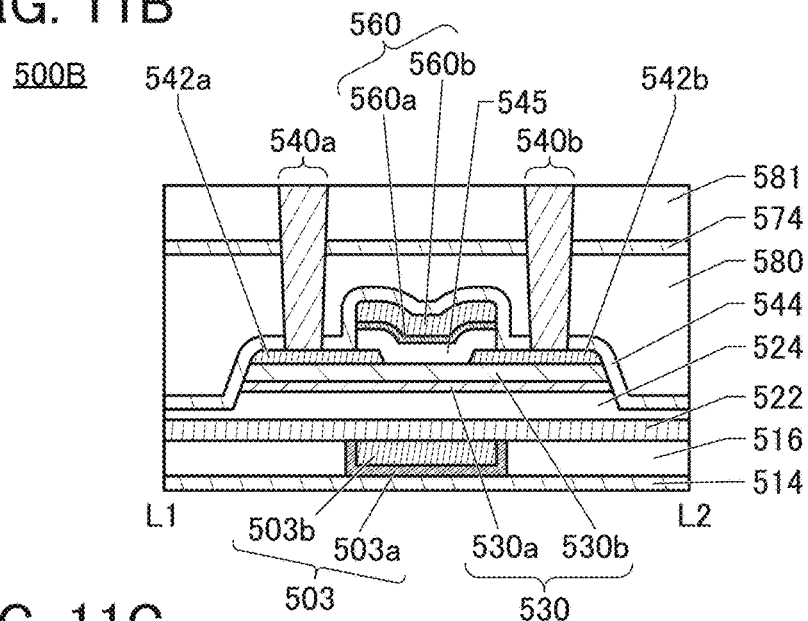
Figure 11C:
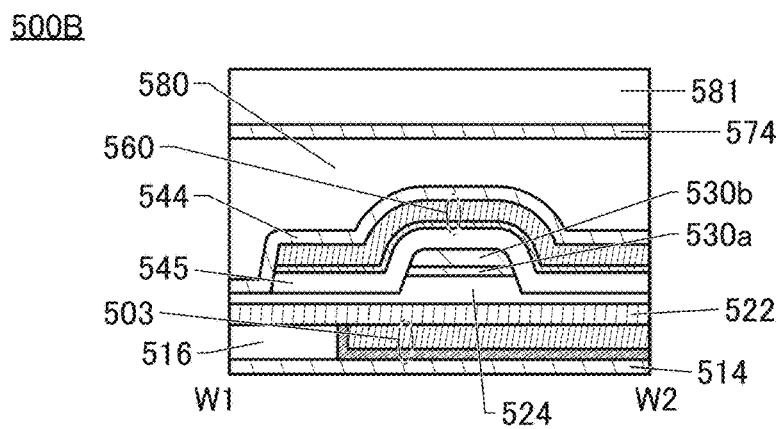

A structure example of a transistor 500B is described with reference to FIG. 11A, FIG. 11B, and FIG. 11C. FIG. 11A is a top view of the transistor 500B. FIG. 11B is a cross-sectional view of a portion indicated by dashed-dotted line L1-L2 in FIG. 11A. FIG. 11C is a cross-sectional view of a portion indicated by a dashed-dotted line W1-W2 in FIG. 11A. Note that for clarity of the drawing, some components are not shown in the top view of FIG. 11A.

The transistor 500B is a modification example of the transistor 500 and can be replaced with the transistor 500. Therefore, differences of the transistor 500B from the transistor 500 are mainly described to avoid repeated description.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be extended. That is, the conductor 560a inhibits oxidation of the conductor 560b, thereby preventing the decrease in conductivity.

The insulator 544 is preferably provided to cover the top surface and the side surface of the conductor 560 and a side surface of the insulator 545. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping part of the conductor 542a and part of the conductor 542b, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described above in this embodiment can be used in combination as appropriate with the compositions, structures, methods, and the like described in the other embodiments, the example, and the like.

Embodiment 3

In this embodiment, oxide semiconductor which is a kind of metal oxides is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, classifications of the crystal structures of an oxide semiconductor are described with reference to FIG. 12A. FIG. 12A is a diagram showing classifications of crystal structures of an oxide semiconductor, typically IGZO (metal oxide containing In, Ga, and Zn).

As shown in FIG. 12A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 12A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. Here, FIG. 12B shows an XRD spectrum, which is obtained by GIXD (Grazing-Incidence XRD) measurement, of a CAAC-IGZO film classified into "Crystalline". The horizontal axis represents 2θ [deg.] and the vertical axis represents intensity [a.u.]. Note that a GIXD method is also referred to as a thin film method or a Seemann-Bohlin method. The XRD spectrum that is shown in FIG. 12B and obtained by GIXD measurement is hereinafter simply referred to as an XRD spectrum. The CAAC-IGZO film in FIG. 12B has a composition in the vicinity of In:Ga:Zn=4:2:3 [atomic ratio]. The CAAC-IGZO film in FIG. 12B has a thickness of 500 nm.

As shown in FIG. 12B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 12B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 12C shows a diffraction pattern of the CAAC-IGZO film. FIG. 12C shows a diffraction pattern obtained with the NBED method in which an electron beam is incident in the direction parallel to the substrate. The composition of the CAAC-IGZO film in FIG. 12C is In:Ga:Zn=4:2:3 [atomic ratio] or the neighborhood thereof. In the nanobeam electron diffraction method, electron diffraction is performed with a probe diameter of 1 nm.

As shown in FIG. 12C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 12A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In-Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In-Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The composition, structure, method, and the like described above in this embodiment can be used in combination as appropriate with the compositions, structures, methods, and the like described in the other embodiments, the example, and the like.

Embodiment 4

In this embodiment, application examples of the above-described semiconductor device are described.

[Semiconductor Wafer and Chip]

Figure 13A:
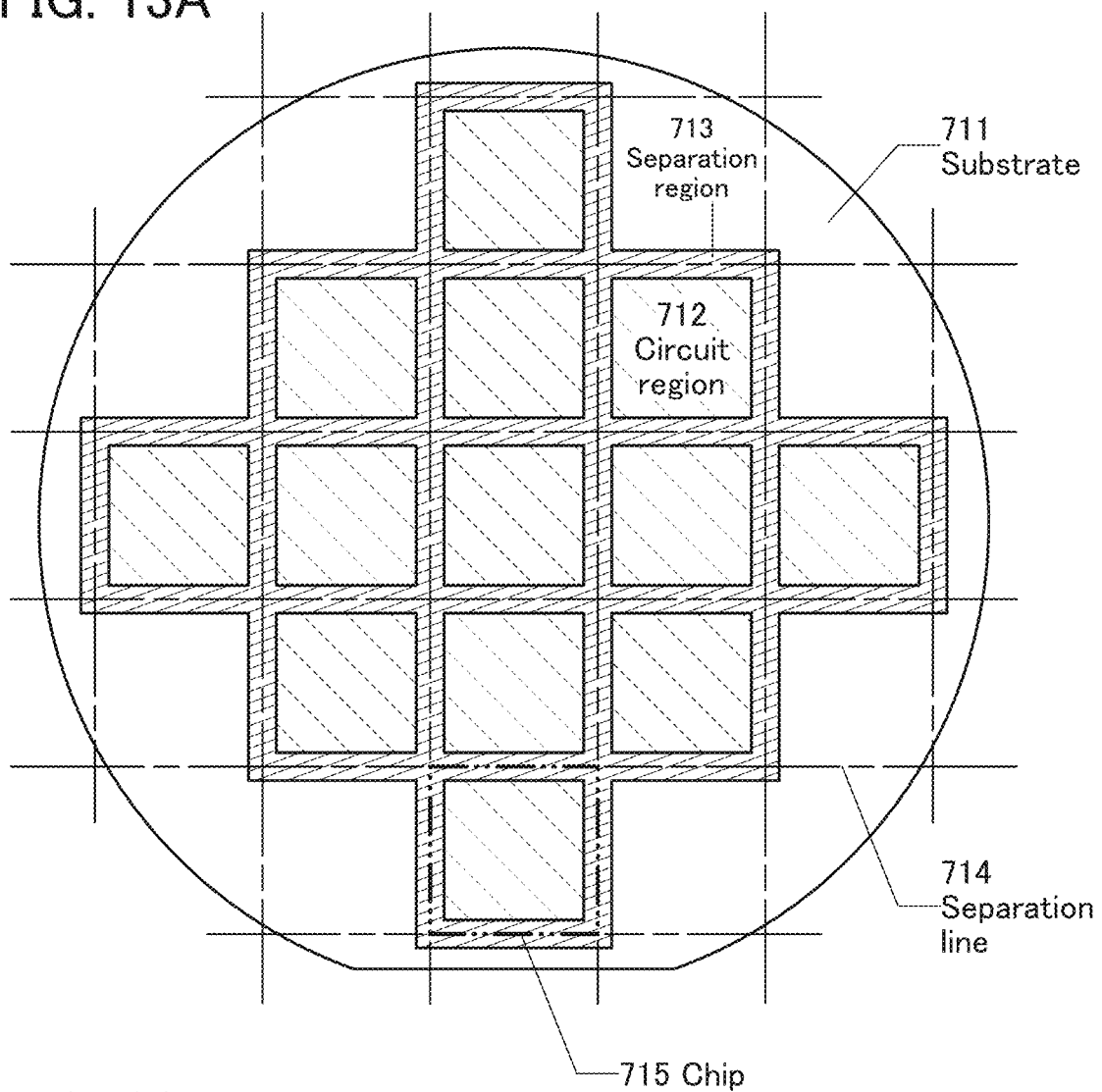
FIG. 13A is a top view of a semiconductor wafer.

FIG. 13A is a top view of a substrate 711 before dicing treatment. As the substrate 711, a semiconductor substrate (also referred to as a "semiconductor wafer") can be used, for example. A plurality of circuit regions 712 are provided over the substrate 711. A semiconductor device, a CPU, an RF tag, an image sensor, or the like of one embodiment of the present invention can be provided in the circuit region 712.

Figure 13B:
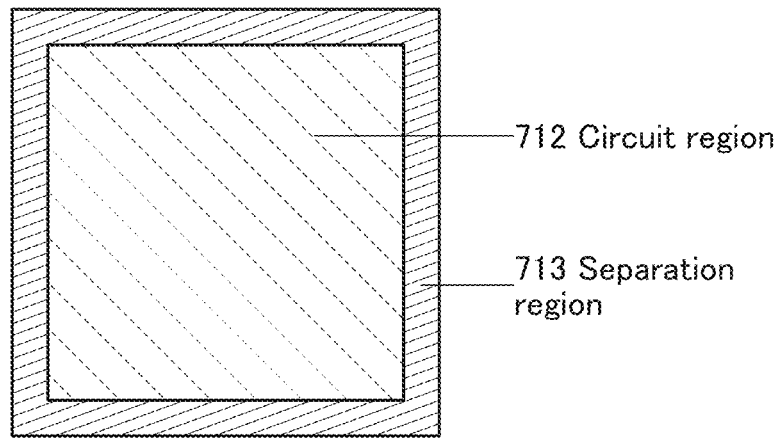
FIG. 13B is a top view of a chip.

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 13B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing semiconductor devices can be reduced. Moreover, semiconductor devices can be manufactured with improved productivity.

For a semiconductor layer provided in the separation regions 713, a material having a band gap of 2.5 eV or more and 4.2 eV or less, preferably 2.7 eV or more and 3.5 eV or less is preferably used. The use of such a material allows accumulated charges to be released slowly; thus, the rapid move of charges due to ESD can be suppressed and electrostatic breakdown is less likely to occur.

[Electronic Component]

FIG. 14 shows an example in which the chip 715 is used in an electronic component. Note that the electronic component is also referred to as a semiconductor package or an IC package. This electronic component has a plurality of standards and names depending on a terminal extraction direction and a terminal shape.

The electronic component is completed when the semiconductor device described in the above embodiment is combined with components other than the semiconductor device in an assembly process (post-process).

Figure 14A:
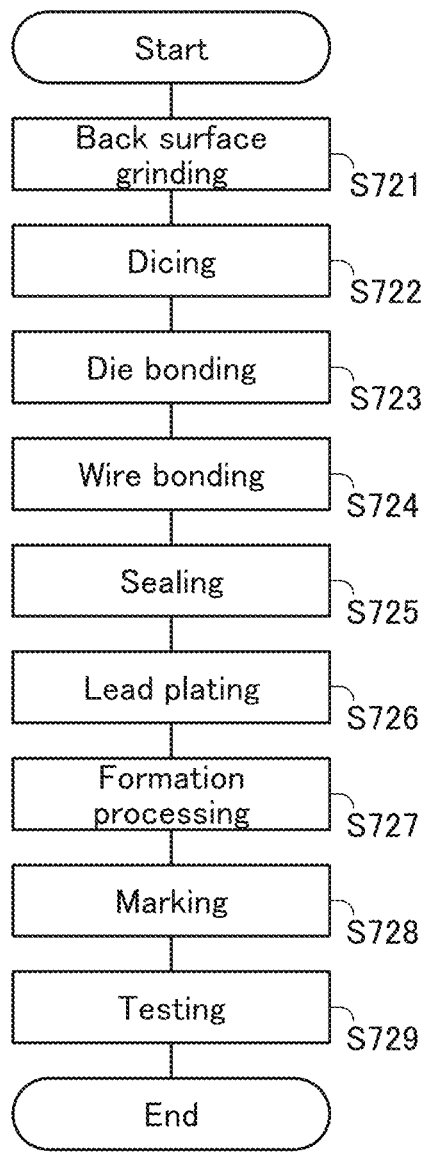
FIG. 14A is a flowchart illustrating an example of a fabrication step of an electronic component.

The post-process is described with reference to a flow chart in FIG. 14A. After an element substrate including the semiconductor device described in the above embodiment is completed in a pre-process, a back surface grinding step in which a back surface (a surface where a semiconductor device and the like are not formed) of the element substrate is ground is performed (Step S721). When the element substrate is thinned by grinding, warpage or the like of the element substrate is reduced, so that the size of the electronic component can be reduced.

Next, the element substrate is divided into a plurality of chips (chips 715) in a dicing step (Step S722). Then, the divided chips are separately picked up to be bonded to a lead frame in a die bonding step (Step S723). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step of electrically connecting a lead of the lead frame and an electrode on the chip through a metal fine line (wire) is performed (Step S724). A silver line or a gold line can be used as the metal fine line. Ball bonding or wedge bonding can be used as the wire bonding.

The wire-bonded chip is subjected to a sealing step (molding step) of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (a decrease in reliability) due to moisture or dust can be reduced.

Subsequently, the lead of the lead frame is plated in a lead plating step (Step S726). This plating process prevents rust of the lead and enables more reliable soldering at the time of mounting the electronic component on a printed circuit board in a later step. Then, the lead is cut and processed in a formation step (Step S727).

Next, a printing (marking) step is performed on a surface of the package (Step S728). After a testing step (Step S729) for checking whether an external shape is good and whether there is a malfunction, for example, the electronic component is completed.

Figure 14B:
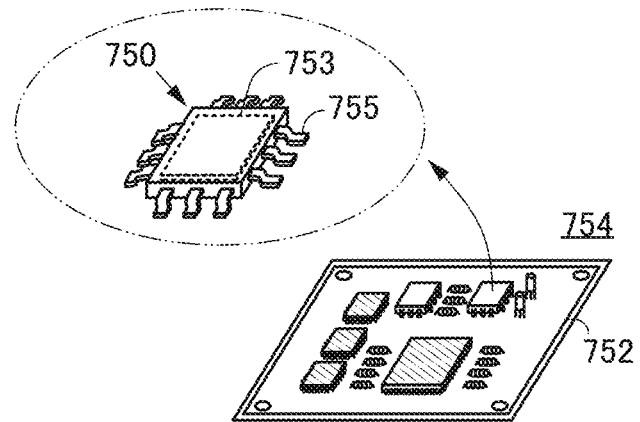
FIG. 14B is a schematic perspective view of the electronic component.

FIG. 14B is a schematic perspective view of a completed electronic component. FIG. 14B is a schematic perspective view illustrating a quad flat package (QFP) as an example of the electronic component. An electronic component 750 in FIG. 14B includes a lead 755 and a semiconductor device 753. As the semiconductor device 753, the semiconductor device described in the above embodiment or the like can be used.

The electronic component 750 in FIG. 14B is mounted on a printed circuit board 752, for example. A plurality of electronic components 750 are combined and electrically connected to each other over the printed circuit board 752; thus, a substrate on which the electronic components are mounted (a circuit board 754) is completed. The completed circuit board 754 is provided in an electronic device or the like.

[Electronic device]

Next, examples of electronic devices each including the semiconductor device of one embodiment of the present invention or the above-described electronic component are described.

Examples of electronic devices including the semiconductor device of one embodiment of the present invention or the electronic component include display devices of televisions, monitors, and the like; lighting devices; desktop personal computers; laptop personal computers; word processors; image reproduction devices that reproduce still images and moving images stored in recording media such as DVDs (Digital Versatile Discs); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws;

smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects and the like driven by electric motors using electric power from the power storage devices are also included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The semiconductor device of one embodiment of the present invention or the electronic component can be used for a communication device or the like incorporated in any of the electronic devices.

The electronic devices may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), for example.

The electronic devices can have a variety of functions such as a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium, for example.

Figure 15:
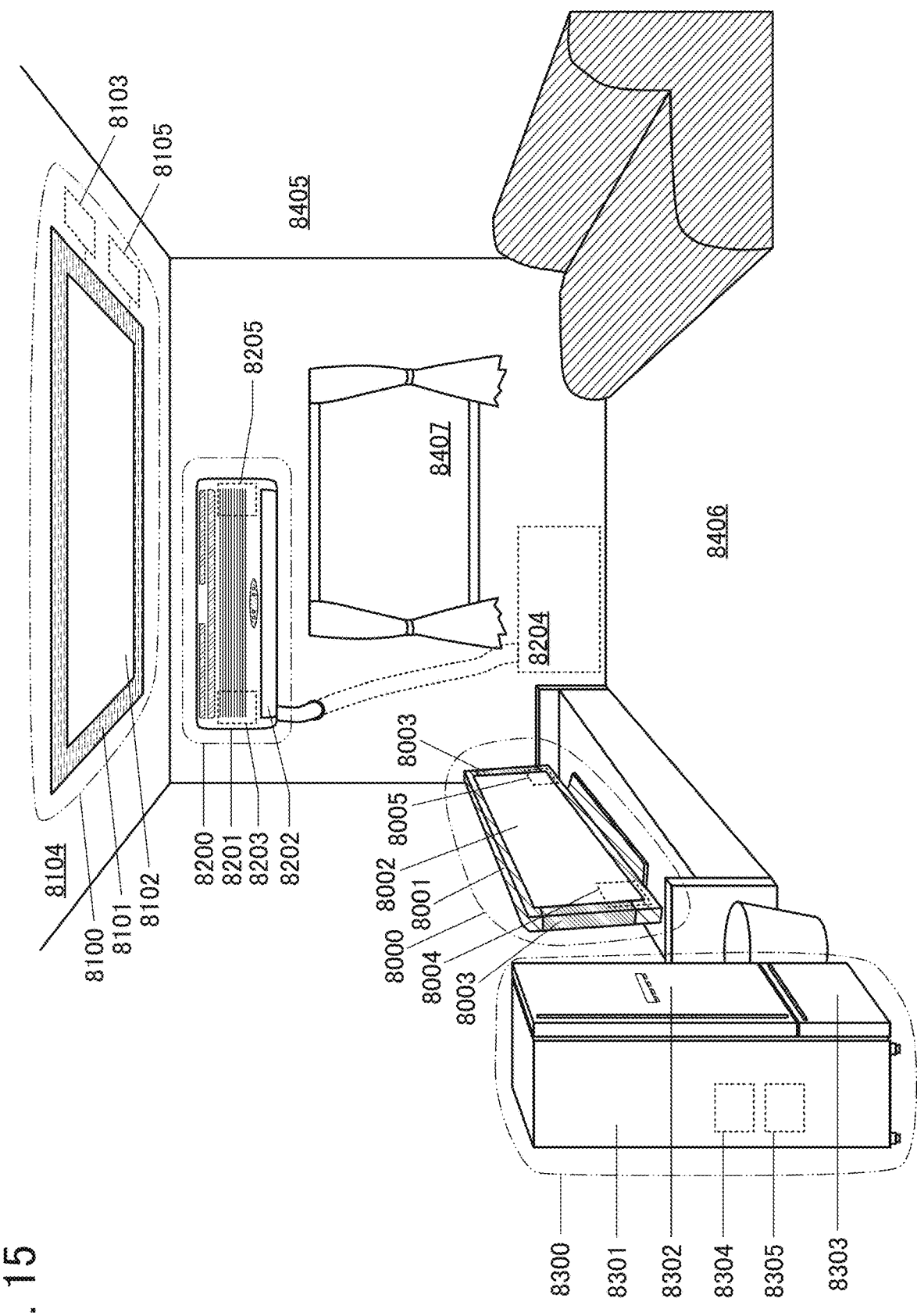
FIG. 15 is a diagram illustrating examples of electronic devices.

FIG. 15 and FIGS. 16A to 16F illustrate examples of electronic devices. In FIG. 15, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like.

The semiconductor device 8004 of one embodiment of the present invention is provided in the housing 8001. The semiconductor device 8004 can retain control data, a control program, or the like. The semiconductor device 8004 has a communication function, and the display device 8000 can function as an IoT device. The display device 8000 can receive electric power from a commercial power supply. Alternatively, the display device 8000 can use electric power stored in the power storage device 8005.

A display device such as a liquid crystal display device, a light-emitting display device in which a light-emitting element such as an organic EL element is provided in each pixel, an electrophoresis display device, a DMD (Digital Micromirror Device), a PDP (Plasma Display Panel), or an FED (Field Emission Display) can be used for the display portion 8002.

Note that the display device includes, in its category, all of information display devices for personal computers, advertisement displays, and the like besides TV broadcast reception.

In FIG. 15, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although FIG. 15 illustrates the case where the semiconductor device 8103 is provided in a ceiling 8104 on which the housing 8101 and the light source 8102 are installed, the semiconductor device 8103 may be provided in the housing 8101. The semiconductor device 8103 can retain data such as emission luminance of the light source 8102, a control program, or the like. The semiconductor device 8103 has a communication function, and the lighting device 8100 can function as an IoT device. The lighting device 8100 can receive electric power from a commercial power supply. Alternatively, the lighting device 8100 can use electric power stored in the power storage device.

Although FIG. 15 illustrates the installation lighting device 8100 provided in the ceiling 8104 as an example, the semiconductor device of one embodiment of the present invention can be used in an installation lighting device provided in, for example, a wall 8405, a floor 8406, a window 8407, or the like other than the ceiling 8104. Alternatively, the semiconductor device of one embodiment of the present invention can be used in a tabletop lighting device or the like.

As the light source 8102, an artificial light source that emits light artificially by using electric power can be used. Specific examples of the artificial light source include an incandescent lamp, a discharge lamp such as a fluorescent lamp, and light-emitting elements such as an LED and an organic EL element.

In FIG. 15, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, a power storage device 8205, and the like. Although FIG. 15 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can retain control data, a control program, or the like of the air conditioner. The semiconductor device 8203 has a communication function, and the air conditioner can function as an IoT device. The air conditioner can receive electric power from a commercial power supply. Alternatively, the air conditioner can use electric power stored in the power storage device 8205.

Although FIG. 15 illustrates the split-type air conditioner including the indoor unit and the outdoor unit as an example, the semiconductor device of one embodiment of the present invention can be used in an air conditioner in which the functions of an indoor unit and an outdoor unit are integrated in one housing.

In FIG. 15, an electric refrigerator-freezer 8300 is an example of an electronic device including a semiconductor device 8304 of one embodiment of the present invention. Specifically, the electric refrigerator-freezer 8300 includes a housing 8301, a refrigerator door 8302, a freezer door 8303, the semiconductor device 8304, a power storage device 8305, and the like. In FIG. 15, the power storage device 8305 is provided in the housing 8301. The semiconductor device 8304 can retain control data, a control program, or the like of the electric refrigerator-freezer 8300. The semiconductor device 8304 has a communication function, and the electric refrigerator-freezer 8300 can function as an IoT device. The electric refrigerator-freezer 8300 can receive electric power from a commercial power supply. Alternatively, the electric refrigerator-freezer 8300 can use electric power stored in the power storage device 8305.

Figure 16A:
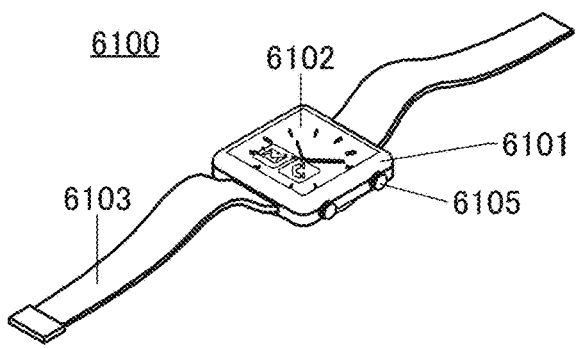
FIG. 16A to FIG. 16F are diagrams showing examples of electronic devices.

FIG. 16A illustrates an example of a watch-type portable information terminal. A portable information terminal 6100 includes a housing 6101, a display portion 6102, a band 6103, operation buttons 6105, and the like. The portable information terminal 6100 further includes a secondary battery and the semiconductor device of one embodiment of the present invention or the electronic component. The portable information terminal 6100 including the semiconductor device of one embodiment of the present invention or the electronic component can function as an IoT device.

Figure 16B:
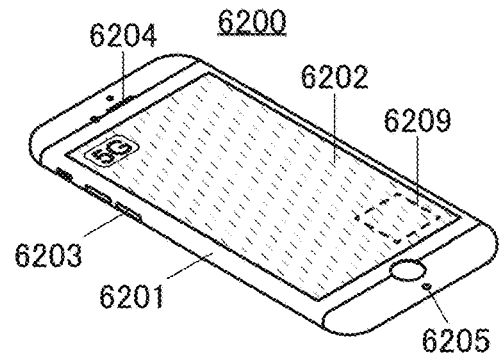

FIG. 16B illustrates an example of a mobile phone. A portable information terminal 6200 includes a display portion 6202 incorporated in a housing 6201, operation buttons 6203, a speaker 6204, a microphone 6205, and the like.

The portable information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 further includes a secondary battery and the semiconductor device of one embodiment of the present invention or the electronic component. The portable information terminal 6200 including the semiconductor device of one embodiment of the present invention or the electronic component can function as an IoT device.

Figure 16C:
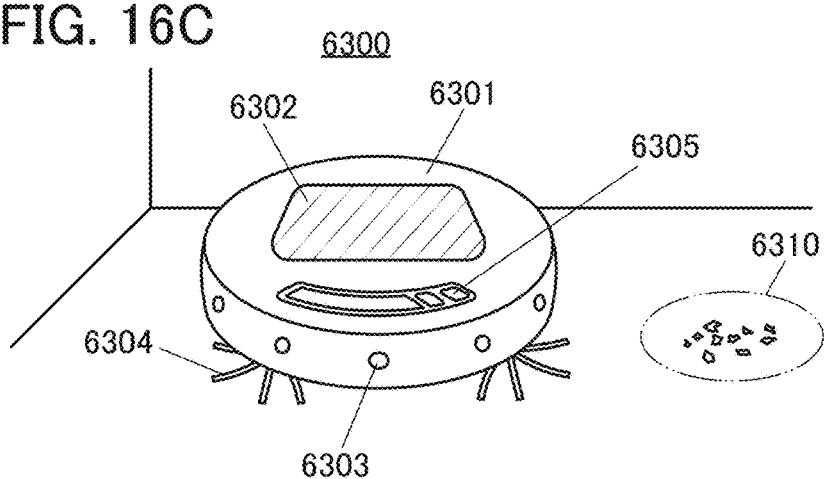

FIG. 16C illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although a tire, an inlet, and the like are not illustrated, the cleaning robot 6300 is provided with the tire, the inlet, and the like. The cleaning robot 6300 is self-propelled, detects dust 6310, and sucks up the dust through the inlet provided on the bottom surface.

For example, the cleaning robot 6300 can determine whether there is an obstacle such as a wall, furniture, or a step by analyzing images taken by the cameras 6303. In the case where the cleaning robot 6300 detects an object that is likely to be caught in the brush 6304 (e.g., a wire) by image analysis, the rotation of the brush 6304 can be stopped. The cleaning robot 6300 further includes a secondary battery and the semiconductor device of one embodiment of the present invention or the electronic component. The cleaning robot 6300 including the semiconductor device of one embodiment of the present invention or the electronic component can function as an IoT device.

Figure 16D:
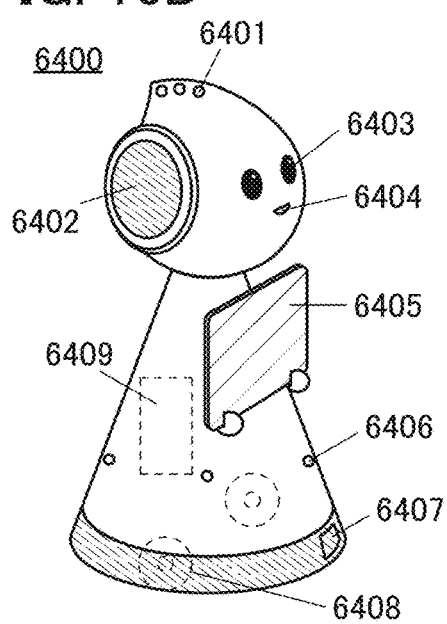

FIG. 16D illustrates an example of a robot. A robot 6400 illustrated in FIG. 16D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user using the microphone 6402 and the speaker 6404.

The display portion 6405 has a function of displaying various kinds of information. The robot 6400 can display information desired by a user on the display portion 6405. The display portion 6405 may be provided with a touch panel. Moreover, the display portion 6405 may be a detachable information terminal, in which case charging and data communication can be performed when the display portion 6405 is set at the home position of the robot 6400.

The upper camera 6403 and the lower camera 6406 each have a function of taking an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407. The light-emitting device of one embodiment of the present invention can be used for the display portion 6405.

The robot 6400 further includes a secondary battery and the semiconductor device of one embodiment of the present invention or the electronic component. The robot 6400 including the semiconductor device of one embodiment of the present invention or the electronic component can function as an IoT device.

Figure 16E:
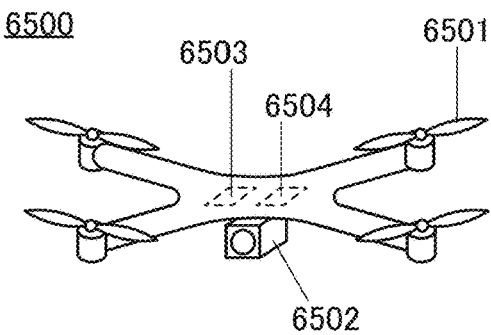

FIG. 16E illustrates an example of a flying object. A flying object 6500 illustrated in FIG. 16E includes propellers 6501, a camera 6502, a battery 6503, and the like and has a function of flying autonomously.

For example, image data taken by the camera 6502 is stored in an electronic component 6504. The electronic component 6504 can analyze the image data to detect whether there is an obstacle in the way of the movement. Moreover, the electronic component 6504 can estimate the remaining battery level from a change in the power storage capacity of the battery 6503. The flying object 6500 further includes the semiconductor device of one embodiment of the present invention or the electronic component. The flying object 6500 including the semiconductor device of one embodiment of the present invention or the electronic component can function as an IoT device.

Figure 16F:
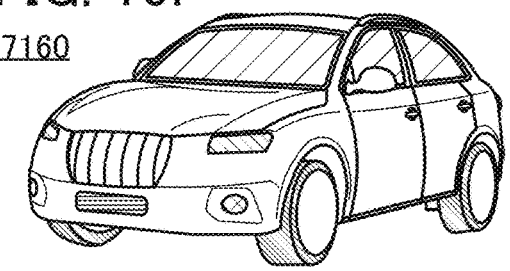

FIG. 16F illustrates an example of an automobile. An automobile 7160 includes an engine, tires, a brake, a steering gear, a camera, and the like. The automobile 7160 further includes the semiconductor device of one embodiment of the present invention or the electronic component. The automobile 7160 including the semiconductor device of one embodiment of the present invention or the electronic component can function as an IoT device.

The structures, the compositions, the methods, and the like described in this embodiment can be combined as appropriate with any of the structures, the compositions, the methods, and the like described in the other embodiments and examples.

Embodiment 5

A normally-off CPU (also referred to as "Noff-CPU") can be achieved by using the OS transistor described in this specification and the like. Note that the Noff CPU is an integrated circuit including a normally-off transistor, which is in a non-conduction state (also referred to as an off state) even when a gate voltage is 0 V.

In the Noff CPU, power supply to a circuit that does not need to operate can be stopped so that the circuit can be brought into a standby state. The circuit brought into the standby state because of the stop of power supply does not consume power. Thus, the power usage of the Noff CPU can be minimized. Moreover, the Noff CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff CPU can be reduced without a significant decrease in operation speed.

The Noff CPU can be suitably used for a small-scale system such as an IoT end device (also referred to as an endpoint microcomputer) 803 in the IoT (Internet of Things) field, for example.

Figure 17:
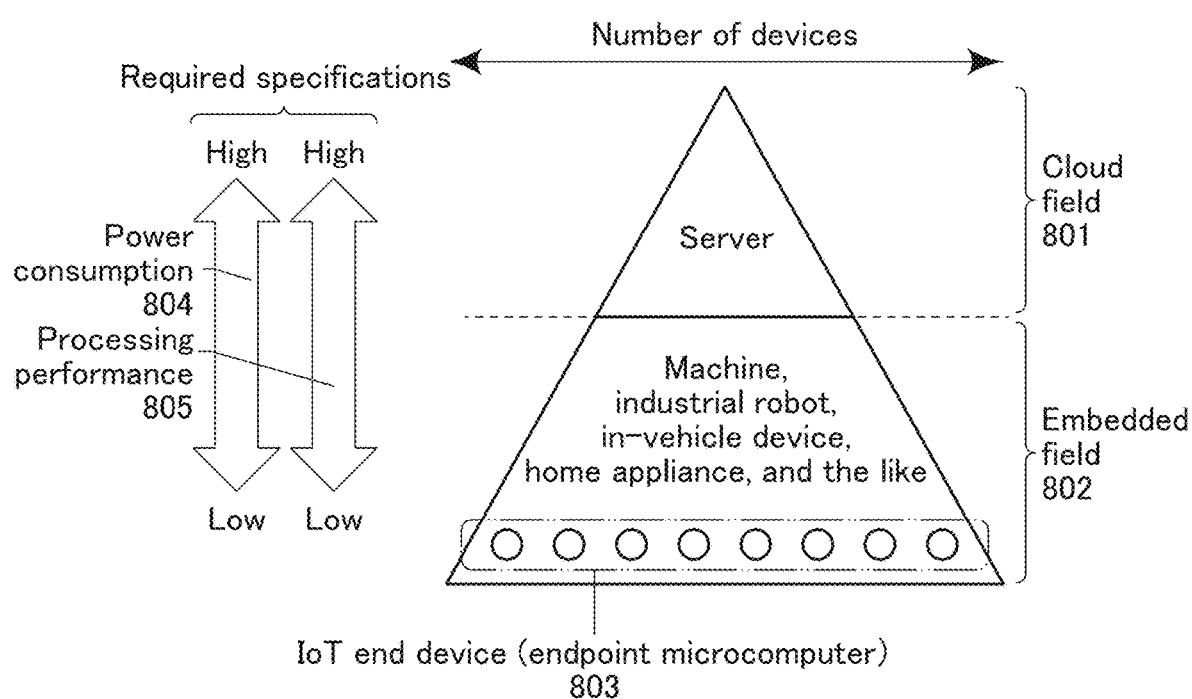
FIG. 17 is a diagram illustrating a hierarchical structure of an IoT network and tendencies of required specifications.

FIG. 17 shows a hierarchical structure of an IoT network and tendencies of required specifications. FIG. 17 shows power consumption 804 and processing performance 805 as the required specifications. The hierarchical structure of the IoT network is roughly divided into a cloud field 801 at the top and an embedded field 802 at the bottom. The cloud field 801 includes a server, for example. The embedded field 802 includes a machine, an industrial robot, an in-vehicle device, and a home appliance, for example.

Higher processing performance is required rather than lower power consumption towards the top of the hierarchical structure. Thus, a high-performance CPU, a high-performance GPU, a large-scale SoC (System on a Chip), and the like are used in the cloud field 801. Furthermore, lower power consumption is required rather than higher processing performance towards the bottom of the hierarchical structure, and the number of devices is explosively increased. The semiconductor device of one embodiment of the present invention can be suitably used for a communication device in the IoT end device that needs to have low power consumption.

Note that an endpoint refers to an end region of the embedded field 802. Examples of a device used in the endpoint include microcomputers used in a factory, a home appliance, infrastructure, agriculture, and the like.

Figure 18:
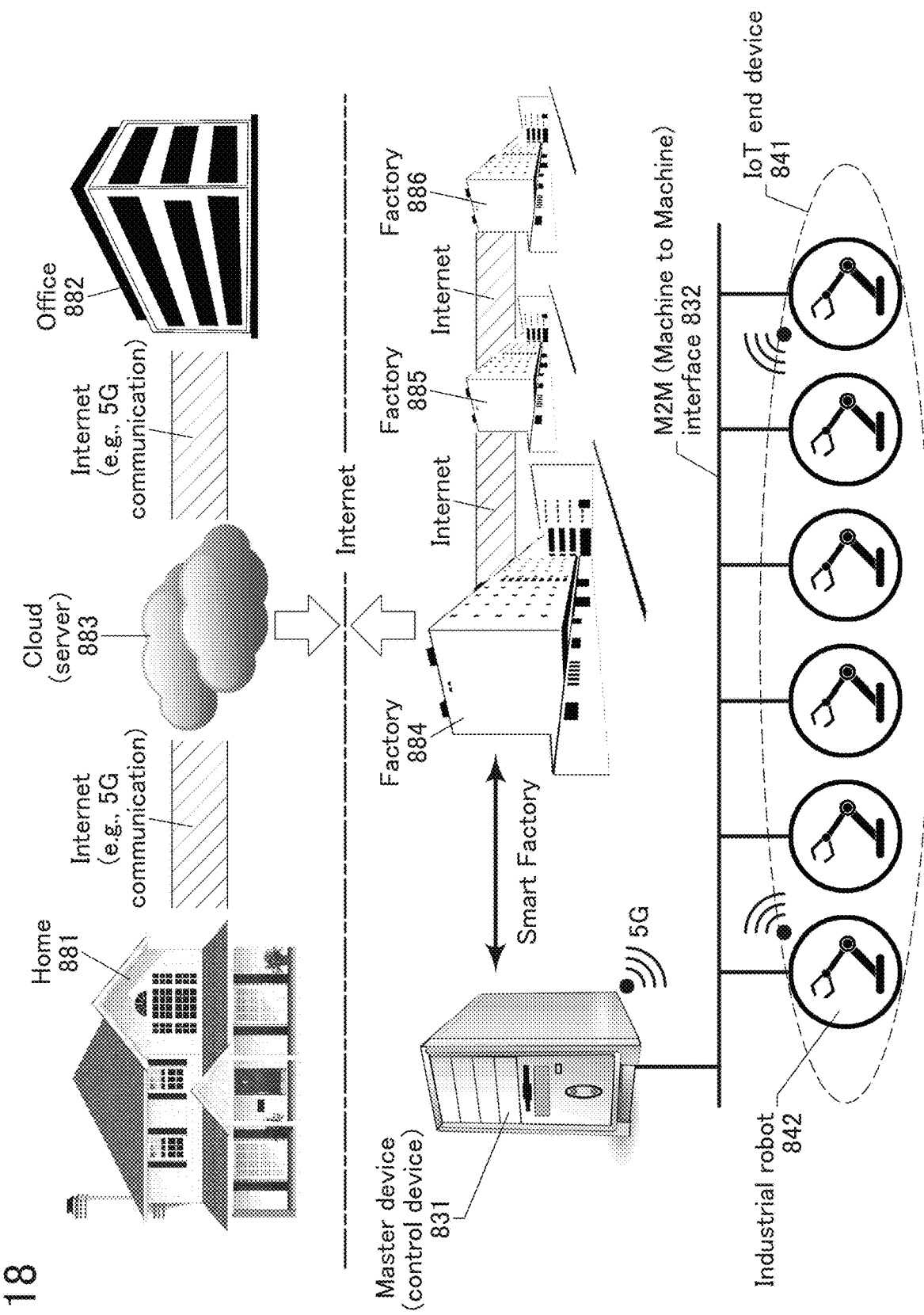
FIG. 18 is a conceptual diagram of factory automation.

FIG. 18 is an image diagram showing factory automation as an application example of the endpoint microcomputer. A factory 884 is connected to a cloud 883 through Internet connection. The cloud 883 is connected to a home 881 and an office 882 through Internet connection. The Internet connection may be wired communication or wireless communication.

In the case of wireless communication, for example, wireless communication based on a communication standard such as the fourth-generation mobile communications system (4G) or the fifth-generation mobile communications system (5G) is performed using the semiconductor device of one embodiment of the present invention for a communication device. The factory 884 may be connected to a factory 885 and a factory 886 through Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through an M2M (Machine to Machine) interface 832. As the M2M interface 832, for example, industrial Ethernet (Ethernet is a registered trademark), which is a kind of wired communication, or local 5G, which is a kind of wireless communication, may be used.

A manager of the factory can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories; this situation is called Smart Factory. Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the Noff CPU. Although the embedded field of IoT sometimes requires quick response, the use of the Noff CPU achieves high-speed return from a standby state.

The structures, the compositions, the methods, and the like described in this embodiment can be combined as appropriate with any of the structures, the compositions, the methods, and the like described in the other embodiments and examples, for example.

Example

In this example, the simulation results of the cutoff frequency of an OS-FET that can be used for the present invention are described.

The cutoff frequency ($f_T$) of the OS-FET can be obtained by the following formula 1.

[Formula 1]

$$f_T = \frac{g_m}{2\pi C_g} \quad (1)$$

Here, $C_g$ and $g_m$ denote the gate capacitor and transconductance, respectively, of the OS-FET. The transconductance $g_m$ at a particular drain voltage can be obtained by the following formula 2.

[Formula 2]

$$g_m = \left(\frac{\partial I_d}{\partial V_g}\right)_{V_d} \quad (2)$$

In Formula 2, Vg, Id, and Vd denote the gate voltage, the drain current, and the drain voltage, respectively, of the OS-FET.

Figure 19A:
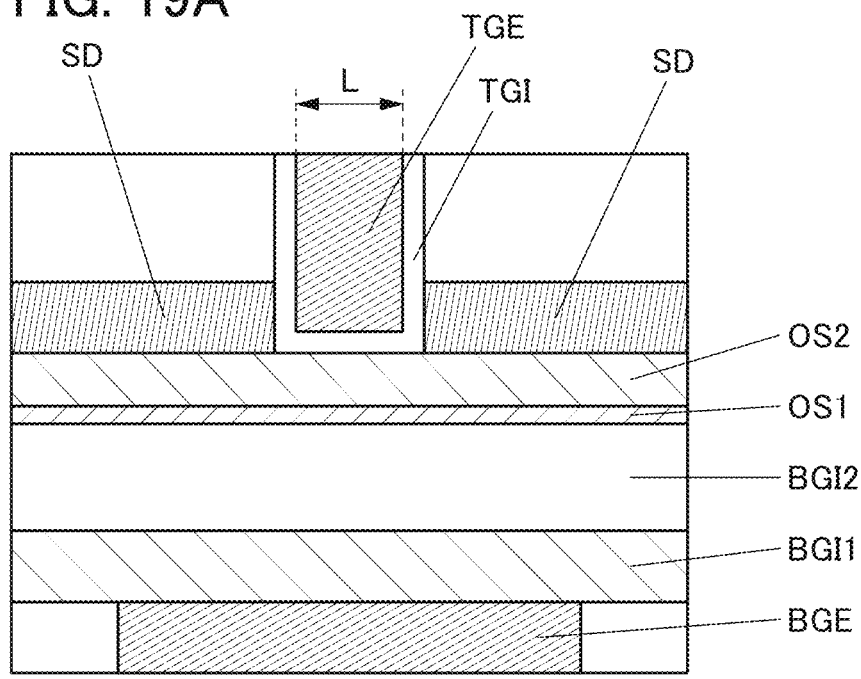
FIG. 19A to FIG. 19C are diagrams showing a structure of an OS-FET used for calculation of the cutoff frequency.
Figure 19B:
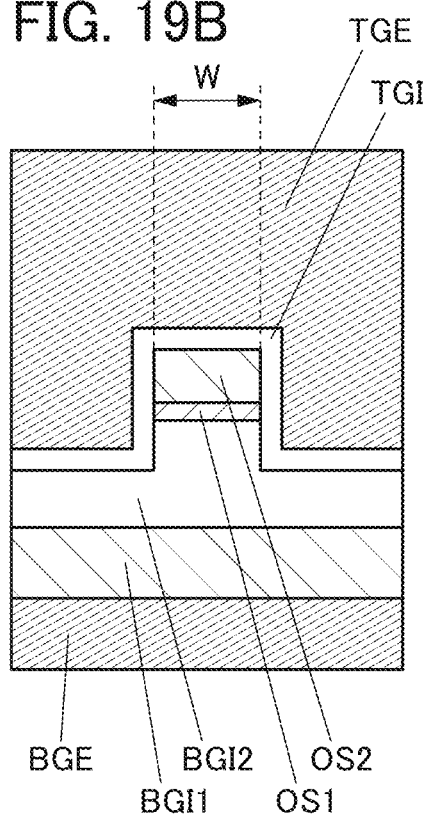
Figure 19C:
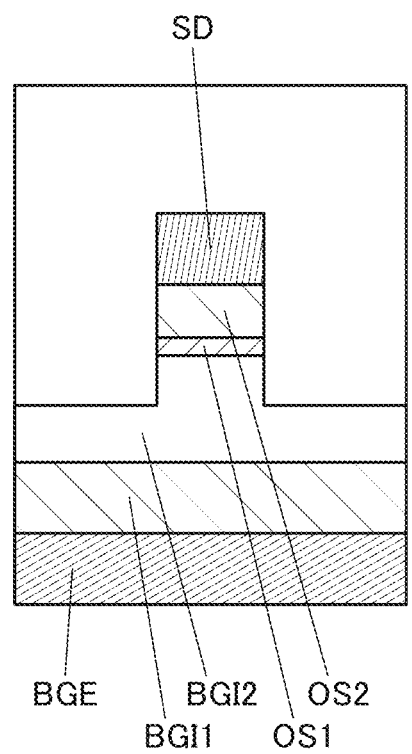

For the calculation of the cutoff frequency, Atlas 3D, a device simulator from Silvaco Inc., is used. FIG. 19A to FIG. 19C illustrate a structure of the OS-FET used for the calculation. FIG. 19A is a schematic cross-sectional view of a center portion of the channel of the OS-FET in the channel length direction. FIG. 19B is a schematic cross-sectional view of the center portion of the channel of the OS-FET in the channel width direction. FIG. 19C is a schematic cross-sectional view of the source region or the drain region of the OS-FET in the channel width direction.

In FIG. 19A to FIG. 19C, the OS-FET includes BGE, BGI1, BGI2, OS1, OS2, SD, TGI, and TGE. BGE functions as a back gate electrode and TGE functions as a gate electrode (also referred to as a top-gate electrode). OS1 and OS2 are a metal oxide having a stacked-layer structure. SD functions as a source electrode and a drain electrode. BGI1 and BGI2 function as a gate insulating film having a stacked-layer structure that is provided between BGE and OS1, and TGI functions as a gate insulating film provided between OS2 and TGE.

As OS1, a metal oxide of In:Ga:Zn=1:3:4 [atomic ratio] is used. As OS2, a metal oxide of In:Ga:Zn=4:2:3 [atomic ratio] is used.

Furthermore, L in FIG. 19A, that is, the width of TGE denotes a channel length, and W in FIG. 19B, that is, the width of OS1 and OS2 denotes a channel width.

Next, Table 1 shows the calculation conditions.

TABLE 1

| Software | | Atlas3D from Silvaco Inc. | |
|---|---|---|---|
| Structure | L | 30 | nm |
| | W | 30 | nm |
| BGE | Work function | 5.0 | eV |
| | Thickness | 20 | nm |
| BGI1 | Relative permittivity | 16.4 | |
| | Thickness | 20 | nm |
| BGI2 | Relative permittivity | 4.1 | |
| | Thickness | 30 | nm |
| TGI | Relative permittivity | 4.1 | nm |
| | Thickness | 6 | nm |
| TGE | Work function | 4.7 | eV |
| | Thickness | 50 | nm |
| SD | Work function | 4.5 | eV |
| | Thickness | 20 | nm |
| OS1 | Electron affinity | 4.5 | eV |
| IGZO | Eg | 3.4 | eV |
| (134) | Relative permittivity | 15 | |
| | Electron mobility | 1.5 | cm²/Vs |
| | Hole mobility | 0.01 | cm²/Vs |
| | Nc | 5E+18 | /cm³ |
| | Nv | 5E+18 | /cm³ |
| | Thickness | 5 | nm |
| OS2 | Electron affinity | 4.6 | eV |
| IGZO | Eg | 3.0 | eV |
| (423) | Relative permittivity | 15 | |
| | Electron mobility | 8 | cm²/Vs |
| | Hole mobility | 0.01 | cm²/Vs |
| | Nc | 5E+18 | /cm³ |
| | Nv | 5E+18 | /cm³ |
| | Thickness | 15 | nm |
| | Nd in n + region | 1E+20 | /cm³ |

Figure 20:
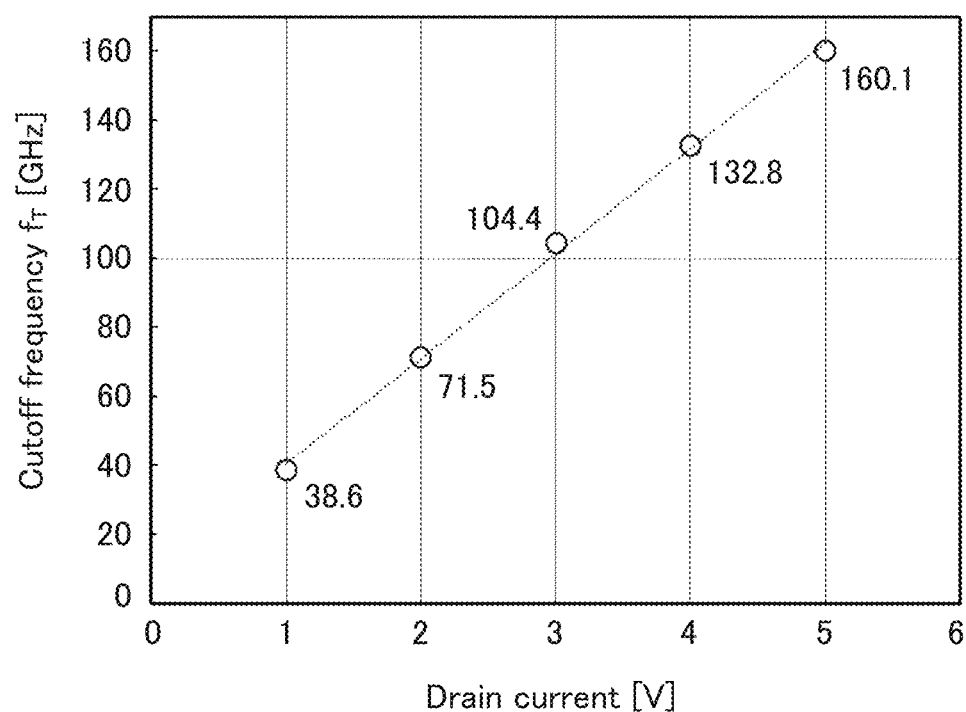
FIG. 20 is a graph showing the calculation results of the cutoff frequency of an OS-FET.

FIG. 20 shows the calculation results of the cutoff frequency of the OS-FET obtained with the above-described conditions. In FIG. 20, the horizontal axis represents the drain voltage (unit: V) of the OS-FET, and the vertical axis represents the cutoff frequency (unit: GHz). In the calculation, the gate voltage and the drain voltage have the same value. Moreover, the channel length of the OS-FET is 30 nm, and the channel width is 30 nm.

From the results in FIG. 20, when the drain voltage is 1 V, the cutoff frequency of the OS-FET is 38.6 GHz; when the drain voltage is 2 V, the cutoff frequency is 71.5 GHz; when the drain voltage is 3 V, the cutoff frequency is 104.4 GHz; when the drain voltage is 4 V, the cutoff frequency is 132.8 GHz; and when the drain voltage is 5 V, the cutoff frequency is 160.1 GHz. The calculation confirms that when the drain voltage is set higher than or equal to 3 V, a cutoff frequency of higher than or equal to 100 GHz can be obtained.

According to the above calculation results, the OS-FET can be favorably used as the transistor of one embodiment of the present invention.

The composition, structure, method, and the like described above in this example can be used in combination as appropriate with the compositions, structures, methods, and the like described in the other embodiments, the example, and the like.

REFERENCE NUMERALS

:NET1: node, 5G: local, 10: frequency voltage converter circuit, 11: loop filter, 12: voltage control oscillator circuit, 21: transistor, 22: transistor, 23: transistor, 24: capacitor, 25: capacitor, 26: functional element, 27: resistor, 28: transistor, 29: transistor, 30: switched capacitor, 31: wiring, 32: wiring, 33: wiring, 34: wiring, 36: signal, 37: wiring, 40: operational amplifier, 41: resistor, 42: capacitor, 43: resistor, 44: resistor, 45: resistor, 46: resistor, 47: capacitor, 48: capacitor, 49: capacitor, 51: transistor, 52: transistor, 53: transistor, 100: semiconductor device, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: insulator, 500: transistor, 500A: transistor, 500B: transistor, 503: conductor, 503a: conductor, 503b: conductor, 510: insulator, 512: insulator, 513: insulator, 514: insulator, 516: insulator, 518: conductor, 520: insulator, 522: insulator, 524: insulator, 526: insulator, 530: oxide, 530a: oxide, 530b: oxide, 540a: conductor, 540b: conductor, 542: conductor, 542a: conductor, 542b: conductor, 543a: region, 543b: region, 544: insulator, 545: insulator, 546: conductor, 548: conductor, 550: transistor, 552: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 711: substrate, 712: circuit region, 713: separation region, 714: separation line, 715: chip, 750: electronic component, 752: printed circuit board, 753: semiconductor device, 754: completed circuit board, 755: lead, 801: cloud field, 802: embedded field, 804: power consumption, 805: processing performance, 831: master device, 832: M2M interface, 841: IoT end device, 842: industrial robot, 881: home, 882: office, 883: cloud, 884: factory, 885: factory, 886: factory, 900: wireless transceiver, 901: low noise amplifier, 902: band pass filter, 903: mixer, 904: band pass filter, 905: demodulator, 911: power amplifier, 912: band pass filter, 913: mixer, 914: band pass filter, 915: modulator, 921: duplexer, 922: local oscillator, 931: antenna, 941: signal, 942: signal, 943: signal, 944: signal, 2001: wiring, 2002: wiring, 6100: portable information terminal, 6101: housing, 6102: display portion, 6103: band, 6105: operation button, 6200: portable information terminal, 6201: housing, 6202: display portion, 6203: operation button, 6204: speaker, 6205: microphone, 6209: fingerprint sensor, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408: moving mechanism, 6409: arithmetic device, 6500: flying object, 6501: propeller, 6502: camera, 6503: battery, 6504: electronic component, 7160: automobile, 8000: display device, 8001: housing, 8002: display portion, 8003: speaker portion, 8004: semiconductor device, 8005: power storage device, 8100: lighting device, 8101: housing, 8102: light source, 8103: semiconductor device, 8104: ceiling, 8105: power storage device, 8200: indoor unit, 8201: housing, 8202: air outlet, 8203: semiconductor device, 8204: outdoor unit, 8205: power storage device, 8300: electric refrigerator-freezer, 8301: housing, 8302: refrigerator door, 8303: freezer door, 8304: semiconductor device, 8305: power storage device, 8405: sidewall, 8406: floor, 8407: window

The invention claimed is:

1. A semiconductor device comprising a first transistor, a second transistor, a third transistor, a first capacitor, a second capacitor, and a functional element,
wherein semiconductor layers of the first transistor to the third transistor comprise an oxide semiconductor,
wherein a gate of the first transistor is electrically connected to one of a source and a drain of the first transistor,
wherein the other of the source and the drain of the first transistor is electrically connected to one of a source and a drain of the second transistor and one electrode of the first capacitor,
wherein the other of the source and the drain of the second transistor is electrically connected to one of a source and a drain of the third transistor and one electrode of the second capacitor,
wherein one electrode of the functional element is electrically connected to a gate of the second transistor and a gate of the third transistor,
wherein an AC signal is supplied to the gates of the second transistor and the third transistor through the functional element,
wherein a first voltage is supplied to a back gate of the second transistor and a back gate of the third transistor, and
wherein a level of a second voltage applied to the one electrode of the first capacitor is changed by control of the first voltage.

2. The semiconductor device according to claim 1, wherein the oxide semiconductor comprises at least one of In and Zn.

3. An oscillator comprising:
the semiconductor device according to claim 1; and
a voltage control oscillator circuit.

* * * * *